US011482542B2

(12) United States Patent
Mizuochi et al.

(10) Patent No.: US 11,482,542 B2
(45) Date of Patent: Oct. 25, 2022

(54) SEMICONDUCTOR INTEGRATED CIRCUIT DEVICE

(71) Applicant: ROHM CO., LTD., Kyoto (JP)

(72) Inventors: Yuta Mizuochi, Kyoto (JP); Yusuke Matsui, Kyoto (JP); Moena Yatabe, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 16/781,771

(22) Filed: Feb. 4, 2020

(65) Prior Publication Data

US 2020/0251497 A1  Aug. 6, 2020

(30) Foreign Application Priority Data

Feb. 6, 2019 (JP) .............................. JP2019-019500
Dec. 4, 2019 (JP) .............................. JP2019-219767
Jan. 7, 2020 (JP) .............................. JP2020-000884

(51) Int. Cl.
  *H01L 27/118* (2006.01)
(52) U.S. Cl.
  CPC .............. *H01L 27/11807* (2013.01); *H01L 2027/11812* (2013.01); *H01L 2027/11829* (2013.01); *H01L 2027/11866* (2013.01); *H01L 2027/11881* (2013.01)
(58) Field of Classification Search
  None
  See application file for complete search history.

(56) References Cited

U.S. PATENT DOCUMENTS

| 6,128,208 | A | * | 10/2000 | Itoh | ................... | H01L 27/10844 |
| | | | | | | 365/230.03 |
| 2010/0133589 | A1 | | 6/2010 | Aruga et al. | | |
| 2013/0249014 | A1 | | 9/2013 | Kito | | |
| 2018/0315743 | A1 | * | 11/2018 | Takeno | ................ | H03K 17/161 |

FOREIGN PATENT DOCUMENTS

| JP | H07273300 | 10/1995 |
| JP | 2008103488 | 5/2008 |
| JP | 2010129895 | 6/2010 |
| JP | 2013201159 | 10/2013 |
| JP | 2016189396 | 11/2016 |

\* cited by examiner

*Primary Examiner* — Steven M Christopher
(74) *Attorney, Agent, or Firm* — Hamre, Schumann, Mueller & Larson, P.C.

(57) ABSTRACT

A semiconductor integrated circuit device includes a first power wiring that is formed on a semiconductor substrate and that extends in a first direction, a second power wiring that extends in the first direction such that the second power wiring is separated from the first power wiring, a first diffusion layer that is used for a p-channel type MOSFET and that is formed in a region between the first power wiring and the second power wiring, a second diffusion layer that is used for an n-channel type MOSFET and that is formed on a side of the second power wiring with respect to the first diffusion layer in the region between the first power wiring and the second power wiring, a first gate electrode that extends in a second direction perpendicular to the first direction and that straddles the first diffusion layer, a second gate electrode that extends in the second direction and that straddles the second diffusion layer, and a third diffusion layer for backgates that is formed below at least one of the first power wiring and the second power wiring and that is placed in a dotted manner along the first direction.

17 Claims, 18 Drawing Sheets

SEMICONDUCTOR INTEGRATED CIRCUIT DEVICE

CROSS-REFERENCE TO RELATED APPLICATIONS

This application corresponds to Japanese Patent Application No. 2019-019500 filed in the Japan Patent Office on Feb. 6, 2019, Japanese Patent Application No. 2019-219767 filed in the Japan Patent Office on Dec. 4, 2019, and Japanese Patent Application No. 2020-000884 filed in the Japan Patent Office on Jan. 7, 2020, the entire disclosures of which are incorporated herein by reference.

TECHNICAL FIELD

The present invention relates to a semiconductor integrated circuit device that has gate arrays.

BACKGROUND ART

A gate array is configured by orderly arranging basic cells in an LSI, and has the advantage of being capable of shortening the manufacturing man-hour, the advantage of being capable of easily amending a circuit at the metal wiring layer level, and so on.

For example, Patent Literature 1 (Japanese Patent Application Publication No. 2008-103488) discloses a semiconductor integrated circuit device that includes basic cells each of which is composed of a pair of p type and n type MOSFETs in which gates are separated. This semiconductor integrated circuit device has a gate array in which basic cells are orderly arranged.

SUMMARY OF INVENTION

On the other hand, in the gate array, the pattern of the basic cell has been predetermined, and therefore a problem resides in the fact that it is difficult to make the cell area smaller than in a standard cell method.

Therefore, an object of the present invention is to provide a semiconductor integrated circuit device that includes a gate array capable of making the length of a basic cell shorter.

A semiconductor integrated circuit device according to an aspect of the present invention includes a first power wiring that is formed on a semiconductor substrate and that extends in a first direction, a second power wiring that extends in the first direction such that the second power wiring is separated from the first power wiring, a first diffusion layer that is used for a p-channel type MOSFET and that is formed in a region between the first power wiring and the second power wiring, a second diffusion layer that is used for an n-channel type MOSFET and that is formed on a side of the second power wiring with respect to the first diffusion layer in the region between the first power wiring and the second power wiring, a first gate electrode that extends in a second direction perpendicular to the first direction and that straddles the first diffusion layer, a second gate electrode that extends in the second direction and that straddles the second diffusion layer, and a third diffusion layer for backgates that is formed below at least one of the first power wiring and the second power wiring and that is placed in a dotted manner along the first direction.

A semiconductor integrated circuit device according to another aspect of the present invention includes a first power wiring that is formed on a semiconductor substrate and that extends in a first direction, a second power wiring that extends in the first direction such that the second power wiring is separated from the first power wiring, a first diffusion layer that is used for a p-channel type MOSFET and that is formed in a region between the first power wiring and the second power wiring, a second diffusion layer that is used for an n-channel type MOSFET and that is formed on a side of the second power wiring with respect to the first diffusion layer in the region between the first power wiring and the second power wiring, a first gate electrode that extends in a second direction perpendicular to the first direction and that straddles the first diffusion layer, a second gate electrode that extends in the second direction and that straddles the second diffusion layer, and a pair of first contact portions, which selectively extend to a region located below the first power wiring from the first diffusion layers that are formed on both sides of the first gate electrode in the first direction.

DESCRIPTION OF EMBODIMENTS

Figure 1:
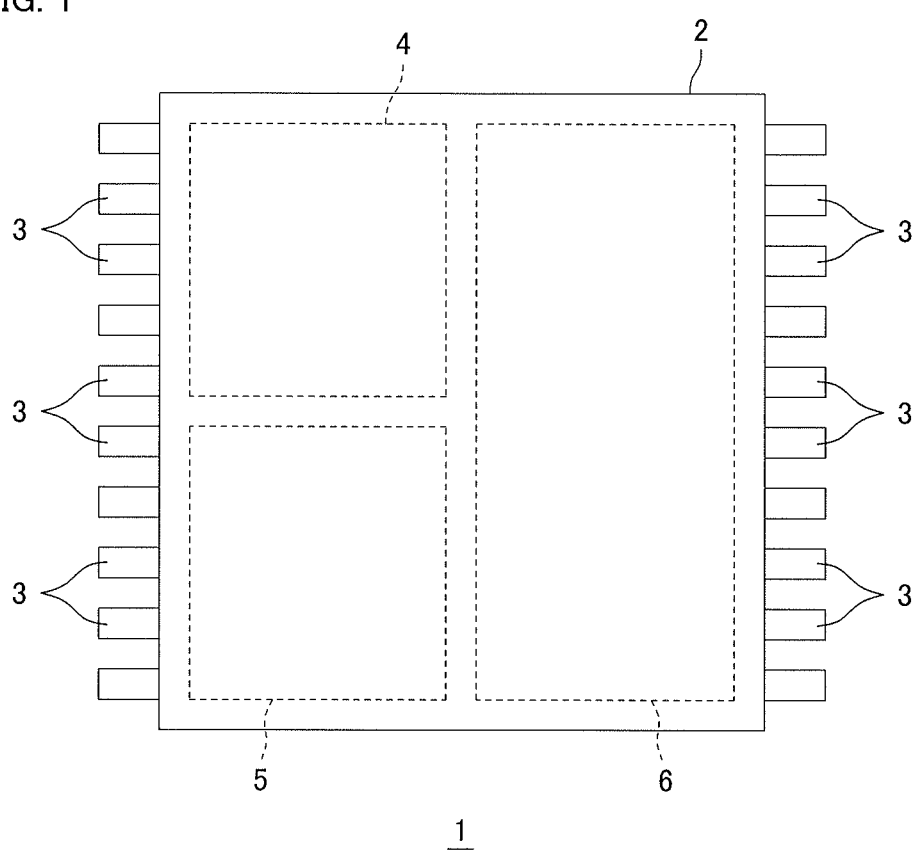
FIG. 1 is a schematic plan view showing an example of the layout of circuit cells of a semiconductor integrated circuit device according to a preferred embodiment of the present invention.

First, preferred embodiments of the present invention will be described in an itemized form.

A semiconductor integrated circuit device according to a first preferred embodiment of the present invention includes a first power wiring that is formed on a semiconductor substrate and that extends in a first direction, a second power wiring that extends in the first direction such that the second power wiring is separated from the first power wiring, a first diffusion layer that is used for a p-channel type MOSFET and that is formed in a region between the first power wiring and the second power wiring, a second diffusion layer that is used for an n-channel type MOSFET and that is formed on a side of the second power wiring with respect to the first diffusion layer in the region between the first power wiring and the second power wiring, a first gate electrode that extends in a second direction perpendicular to the first direction and that straddles the first diffusion layer, a second gate electrode that extends in the second direction and that straddles the second diffusion layer, and a third diffusion layer for backgates that is formed below at least one of the first power wiring and the second power wiring and that is placed in a dotted manner along the first direction.

According to this arrangement, a basic cell including the p-channel type MOSFET and the n-channel type MOSFET is formed in a region between the first power wiring and the second power wiring, and therefore the first power wiring and the second power wiring are not formed in the basic cell. This makes it possible to use the space of the inside of the basic cell for the layout of other wirings, hence making it possible to improve a wiring capability in the basic cell. As a result, room is generated in the space for wiring layout, and therefore it is possible to shorten the length of the basic cell including the p-channel type MOSFET and the n-channel type MOSFET in the second direction. The basic cell may be defined as a fundamental unit on layout including a plurality of semiconductor elements.

Additionally, the third diffusion layer for backgates is formed below at least one of the first and second power wirings, and is placed in a dotted manner along the first direction, and, as a result, it is possible to effectively use a region that is located below the first power wiring and/or the second power wiring and in which the third diffusion layer is not formed.

In the semiconductor integrated circuit device according to the first preferred embodiment of the present invention, the third diffusion layer may include a third diffusion layer for a p-channel type MOSFET which is formed below the first power wiring, and may have a conductivity type opposite to a conductivity type of the first diffusion layer, and the semiconductor integrated circuit device may include a first contact portion that selectively extends from the first diffusion layer toward a region below the first power wiring in which the third diffusion layer for the p-channel type MOSFET is not formed.

According to this arrangement, it is possible to effectively use a region that is located below the first power wiring and in which the third diffusion layer is not formed as the first contact portion for supplying electric power to the first diffusion layer. This makes it possible to further improve a wiring capability in the basic cell because a wiring for supplying electric power to the first diffusion layer is not required to be drawn around in the basic cell.

In the semiconductor integrated circuit device according to the first preferred embodiment of the present invention, the first gate electrode may include a pair of first gate electrodes separated from each other, and a pair of p-channel type MOSFETs may be formed of the pair of first gate electrodes, the first diffusion layer between the pair of first gate electrodes, and the first diffusion layers on both sides of the pair of first gate electrodes, and the first contact portion may extend from the first diffusion layer between the pair of first gate electrodes.

In the semiconductor integrated circuit device according to the first preferred embodiment of the present invention, a length of the first diffusion layer in the second direction may be 0.95 µm to 1.48 µm.

In the semiconductor integrated circuit device according to the first preferred embodiment of the present invention, the third diffusion layer may include a third diffusion layer for an n-channel type MOSFET which is formed below the second power wiring, and may have a conductivity type opposite to a conductivity type of the second diffusion layer, and the semiconductor integrated circuit device may include a second contact portion that selectively extends from the second diffusion layer toward a region below the second power wiring in which the third diffusion layer for the n-channel type MOSFET is not formed.

According to this arrangement, it is possible to effectively use a region that is located below the second power wiring and in which the third diffusion layer is not formed as the second contact portion for supplying electric power to the second diffusion layer. This makes it possible to further improve a wiring capability in the basic cell because a wiring for supplying electric power to the second diffusion layer is not required to be drawn around in the basic cell.

In the semiconductor integrated circuit device according to the first preferred embodiment of the present invention, the second gate electrode may include a pair of second gate electrodes separated from each other, and a pair of n-channel type MOSFETs may be formed of the pair of second gate electrodes, the second diffusion layer between the pair of second gate electrodes, and the second diffusion layers on both sides of the pair of second gate electrodes, and the second contact portion may extend from the second diffusion layer between the pair of second gate electrodes.

In the semiconductor integrated circuit device according to the first preferred embodiment of the present invention, a length of the second diffusion layer in the second direction may be 0.81 µm to 1.34 µm.

In the semiconductor integrated circuit device according to the first preferred embodiment of the present invention, an end portion on a side of the second power wiring of the first gate electrode and an end portion on a side of the first power wiring of the second gate electrode may be connected integrally with each other.

According to this arrangement, a gate electrode is shared between the p-channel type MOSFET and the n-channel type MOSFET, thus making it possible to reduce wirings that are connected to the first gate electrode and to the second gate electrode. As a result, the flexibility of wiring in the basic cell can be improved, and therefore it is possible to further improve a wiring capability in the basic cell.

The semiconductor integrated circuit device according to the first preferred embodiment of the present invention may include a gate contact portion that is formed by a connection portion between the first gate electrode and the second gate electrode and that is larger in width than the first gate electrode and the second gate electrode.

In the semiconductor integrated circuit device according to the first preferred embodiment of the present invention, a distance between the first power wiring and the second power wiring in the second direction may be 3.38 µm to 3.40 µm.

In the semiconductor integrated circuit device according to the first preferred embodiment of the present invention, a plurality of basic cells each of which consists of a total of four MOSFETs that are a pair of the p-channel type MOSFETs and a pair of the n-channel type MOSFETs may be arranged along the first direction in a region between the first power wiring and the second power wiring.

A semiconductor integrated circuit device according to a second preferred embodiment of the present invention includes a first power wiring that is formed on a semiconductor substrate and that extends in a first direction, a second power wiring that extends in the first direction such that the second power wiring is separated from the first power wiring, a first diffusion layer that is used for a p-channel type MOSFET and that is formed in a region between the first power wiring and the second power wiring, a second diffusion layer that is used for an n-channel type MOSFET and that is formed on a side of the second power wiring with respect to the first diffusion layer in the region between the first power wiring and the second power wiring, a first gate electrode that extends in a second direction perpendicular to the first direction and that straddles the first diffusion layer, a second gate electrode that extends in the second direction and that straddles the second diffusion layer, and a pair of first contact portions, which selectively extend to a region located below the first power wiring from the first diffusion layers that are formed on both sides of the first gate electrode in the first direction.

According to this arrangement, a basic cell including the p-channel type MOSFET and the n-channel type MOSFET is formed in a region between the first power wiring and the second power wiring, and therefore the first power wiring and the second power wiring are not formed in the basic cell. This makes it possible to use the space of the inside of the basic cell for the layout of other wirings, hence making it possible to improve a wiring capability in the basic cell. As a result, room is generated in the space for wiring layout, and therefore it is possible to shorten the length of the basic cell including the p-channel type MOSFET and the n-channel type MOSFET in the second direction. The basic cell may be defined as a fundamental unit on layout including a plurality of semiconductor elements.

Additionally, it is possible to effectively use a region that is located below the first power wiring as the first contact portion for supplying electric power to the first diffusion layer. This makes it possible to improve a wiring capability in the basic cell because a wiring for supplying electric power to the first diffusion layer is not required to be drawn around in the basic cell.

In the semiconductor integrated circuit device according to the second preferred embodiment of the present invention, the first gate electrode may include a pair of first gate electrodes separated from each other, and a pair of the p-channel type MOSFETs may be formed of the pair of first gate electrodes, the first diffusion layer between the pair of first gate electrodes, and the first diffusion layers on both sides of the pair of first gate electrodes, and the first contact portion may extend from the first diffusion layers on both sides of the pair of first gate electrodes.

In the semiconductor integrated circuit device according to the second preferred embodiment of the present invention, the region below the first power wiring may include a pair of first regions that overlap with a pair of first imaginary lines in a direction in which the pair of first contact portions extend and a second region placed between the pair of first regions, and the semiconductor integrated circuit device may further include a third diffusion layer formed in the second region such that the third diffusion layer is separated from the pair of first contact portions.

According to this arrangement, it is possible to effectively use a region that is located below the first power wiring and that does not overlap with the first contact portion as the third diffusion layer for backgates. This makes it possible to further improve a wiring capability in the basic cell.

In the semiconductor integrated circuit device according to the second preferred embodiment of the present invention, the third diffusion layer may include a third diffusion layer for the p-channel type MOSFET which has a conductivity type opposite to a conductivity type of the first diffusion layer.

A semiconductor integrated circuit device according to a third preferred embodiment of the present invention includes a first power wiring that is formed on a semiconductor substrate and that extends in a first direction, a second power wiring such that the second power wiring is separated from the first power wiring, a first diffusion layer that is used for a p-channel type MOSFET and that is formed in a region between the first power wiring and the second power wiring, a second diffusion layer that is used for an n-channel type MOSFET and that is formed on a side of the second power wiring with respect to the first diffusion layer in the region between the first power wiring and the second power wiring, a first gate electrode that extends in a second direction perpendicular to the first direction and that straddles the first diffusion layer, a second gate electrode that extends in the second direction and that straddles the second diffusion layer, and a pair of second contact portions, which selectively extend to a region located below the second power wiring from the second diffusion layers that are formed on both sides of the second gate electrode in the first direction.

According to this arrangement, a basic cell including the p-channel type MOSFET and the n-channel type MOSFET is formed in a region between the first power wiring and the second power wiring, and therefore the first power wiring and the second power wiring are not formed in the basic cell. This makes it possible to use the space of the inside of the basic cell for the layout of other wirings, hence making it possible to improve a wiring capability in the basic cell. As a result, room is generated in the space for wiring layout, and therefore it is possible to shorten the length of the basic cell including the p-channel type MOSFET and the n-channel type MOSFET in the second direction. The basic cell may be defined as a fundamental unit on layout including a plurality of semiconductor elements.

Additionally, it is possible to effectively use a region that is located below the second power wiring as the second contact portion for supplying electric power to the second diffusion layer. This makes it possible to improve a wiring capability in the basic cell because a wiring for supplying electric power to the second diffusion layer is not required to be drawn around in the basic cell.

In the semiconductor integrated circuit device according to the third preferred embodiment of the present invention, the second gate electrode may include a pair of second gate electrodes separated from each other, and a pair of n-channel type MOSFETs may be formed of the pair of second gate electrodes, the second diffusion layer between the pair of second gate electrodes, and the second diffusion layers on both sides of the pair of second gate electrodes, and the second contact portion may extend from the second diffusion layer between the pair of second gate electrodes.

In the semiconductor integrated circuit device according to the third preferred embodiment of the present invention, the region located below the second power wiring may include a pair of third regions that overlap with a pair of second imaginary lines in a direction in which the pair of second contact portions extend and a fourth region placed between the pair of third regions, and the semiconductor integrated circuit device may further include a fourth diffusion layer formed in the fourth region such that the fourth diffusion layer is separated from the pair of second contact portions.

According to this arrangement, it is possible to effectively use a region that is located below the second power wiring and that does not overlap with the second contact portion as the fourth diffusion layer for backgates. This makes it possible to further improve a wiring capability in the basic cell.

In the semiconductor integrated circuit device according to the third preferred embodiment of the present invention, the fourth diffusion layer may include a fourth diffusion layer for the n-channel type MOSFET which has a conductivity type opposite to a conductivity type of the second diffusion layer.

In the semiconductor integrated circuit device according to the second and third preferred embodiments of the present invention, a ratio ($L_2/L_1$) of a length $L_2$ in the second direction of the second diffusion layer to a length $L_1$ in the second direction of the first diffusion layer may be 0.45 to 0.70.

In the semiconductor integrated circuit device according to the second and third preferred embodiments of the present invention, an end portion on a side of the second power wiring of the first gate electrode and an end portion on a side of the first power wiring of the second gate electrode may be connected integrally with each other.

According to this arrangement, a gate electrode is shared between the p-channel type MOSFET and the n-channel type MOSFET, thus making it possible to reduce wirings that are connected to the first gate electrode and to the second gate electrode. As a result, the flexibility of wiring in the basic cell can be improved, and therefore it is possible to further improve a wiring capability in the basic cell.

The semiconductor integrated circuit device according to the second and third preferred embodiments of the present invention may include a gate contact portion that is formed by a connection portion between the first gate electrode and the second gate electrode and that is larger in width than the first gate electrode and the second gate electrode.

In the semiconductor integrated circuit device according to the second and third preferred embodiments of the present invention, a distance between the first power wiring and the second power wiring in the second direction may be 4.07 μm to 4.09 μm.

In the semiconductor integrated circuit device according to the second and third preferred embodiments of the present invention, a plurality of basic cells each of which consists of a total of four MOSFETs that are a pair of the p-channel type MOSFETs and a pair of the n-channel type MOSFETs may be arranged along the first direction in a region between the first power wiring and the second power wiring.

DETAILED DESCRIPTION OF PREFERRED EMBODIMENTS OF THE PRESENT INVENTION

Next, preferred embodiments of the present invention will be described in detail with reference to the accompanying drawings.

FIG. 1 is a schematic plan view showing an example of the layout of circuit cells 4, 5, and 6 of a semiconductor integrated circuit device 1 according to a preferred embodiment of the present invention.

The semiconductor integrated circuit device 1 is an electronic component (IC) on which many electronic circuit elements each of which fulfills a predetermined function are mounted. The semiconductor integrated circuit device 1 includes a resin package 2 forming an external shape and a plurality of terminals 3 (outer leads) exposed from the resin package 2.

A plurality of circuit cells 4, 5, and 6 are formed in the resin package 2. In the present preferred embodiment, the first circuit cell 4, the second circuit cell 5, and the third circuit cell 6 are formed in such a way as to be electrically connected to the terminals 3, respectively.

The plurality of circuit cells 4, 5, and 6 can include various circuits. The plurality of circuit cells 4, 5, and 6 may include, for example, logic circuits, such as NAND and NOR, and analog circuits, such as an AD converter and a comparator. The plurality of circuit cells 4, 5, and 6 may differ in area from each other, and, in the present preferred embodiment, the third circuit cell 6 is formed larger in area than the first circuit cell 4 and than the second circuit cell 5. An internal configuration of the first circuit cell 4 will be hereinafter described.

Figure 2:
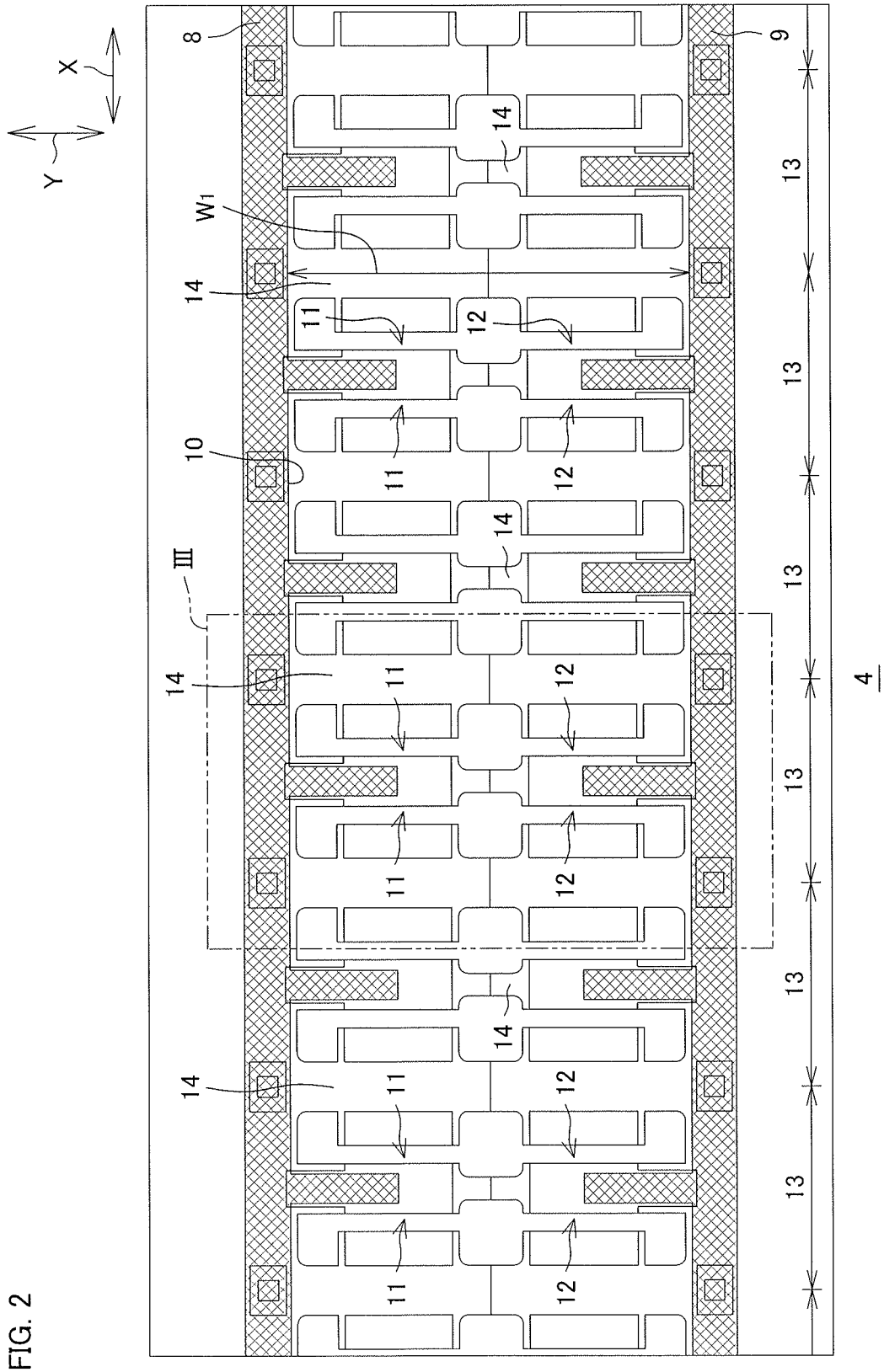
FIG. 2 is a schematic plan view showing an example (first form) of the layout of basic cells (gate array) that are components of the semiconductor integrated circuit device according to the preferred embodiment of the present invention.
Figure 3:
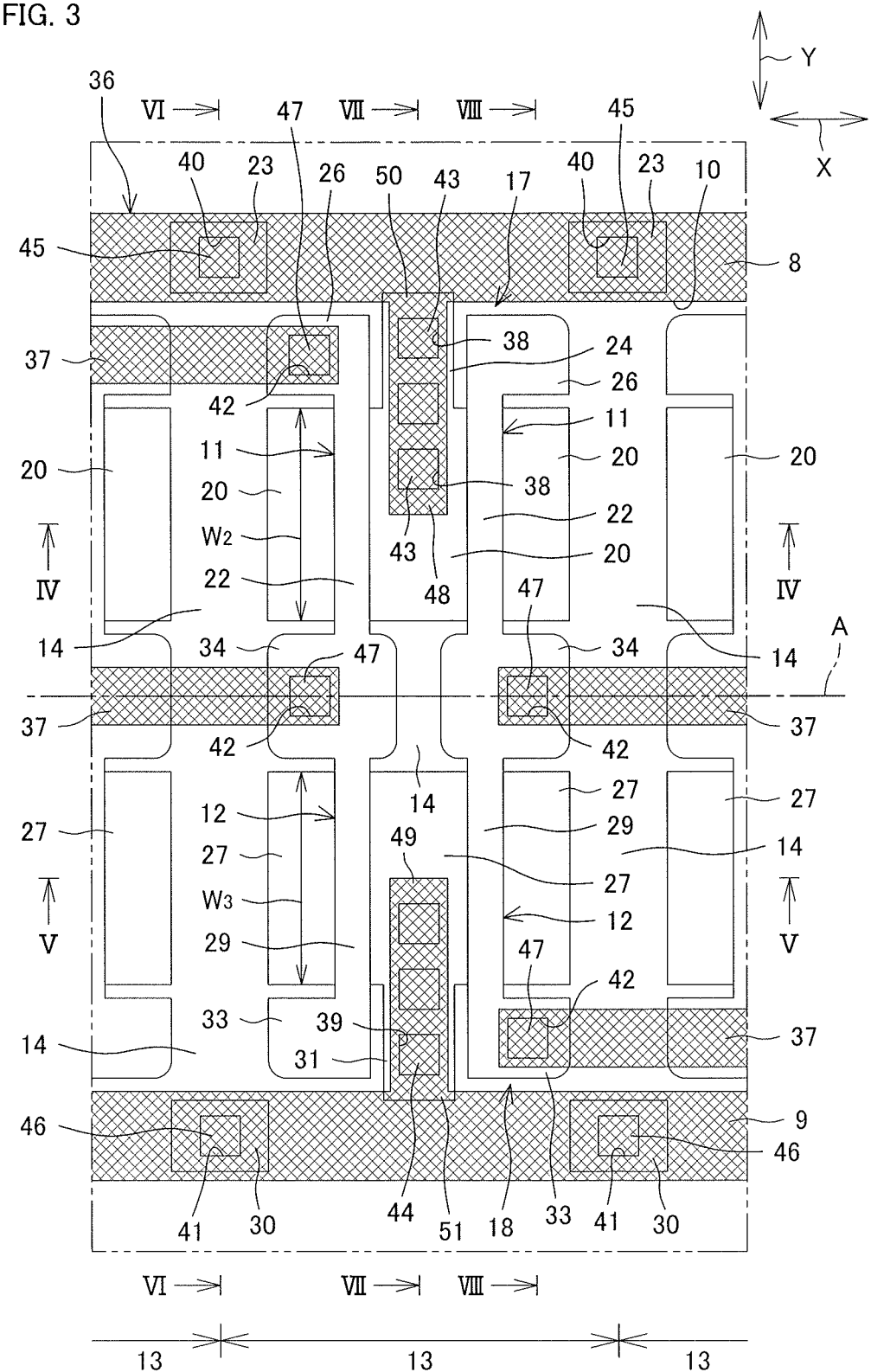
FIG. 3 is an enlarged view of a portion surrounded by an alternate long and two short dashed line III of FIG. 2.
Figure 4:
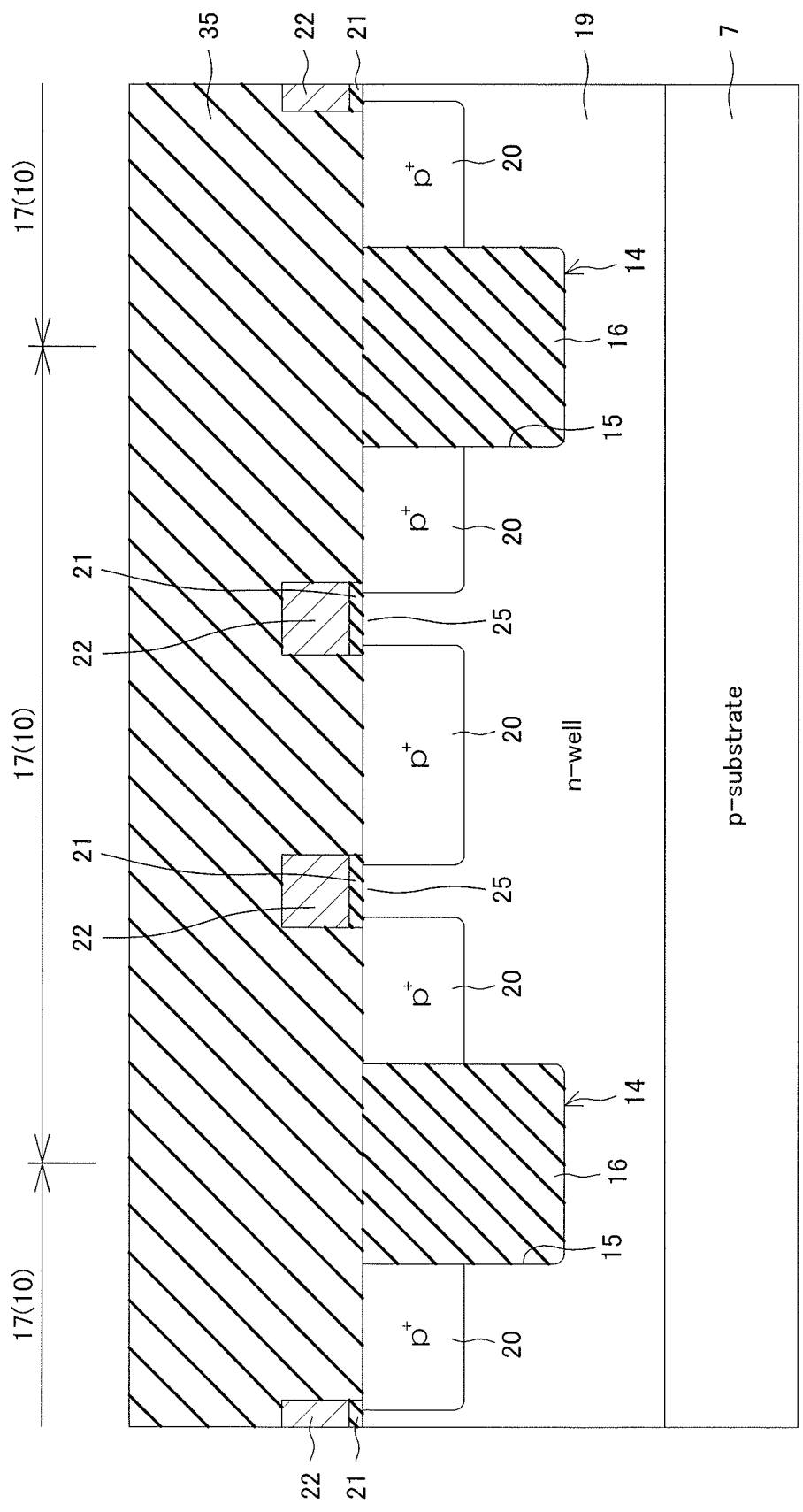
FIG. 4 is a cross-sectional view along line IV-IV of FIG. 3.
Figure 5:
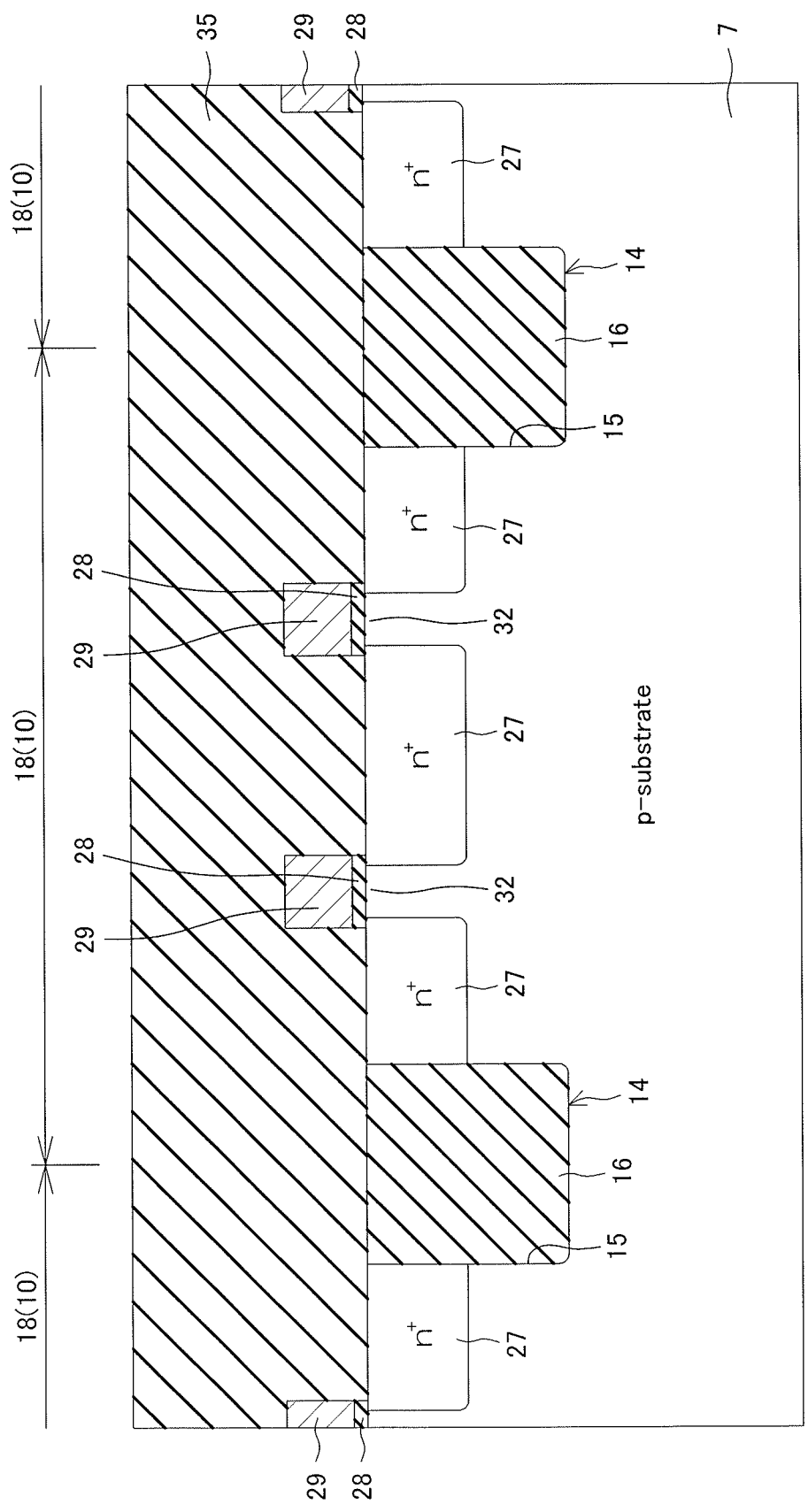
FIG. 5 is a cross-sectional view along line V-V of FIG. 3.
Figure 6:
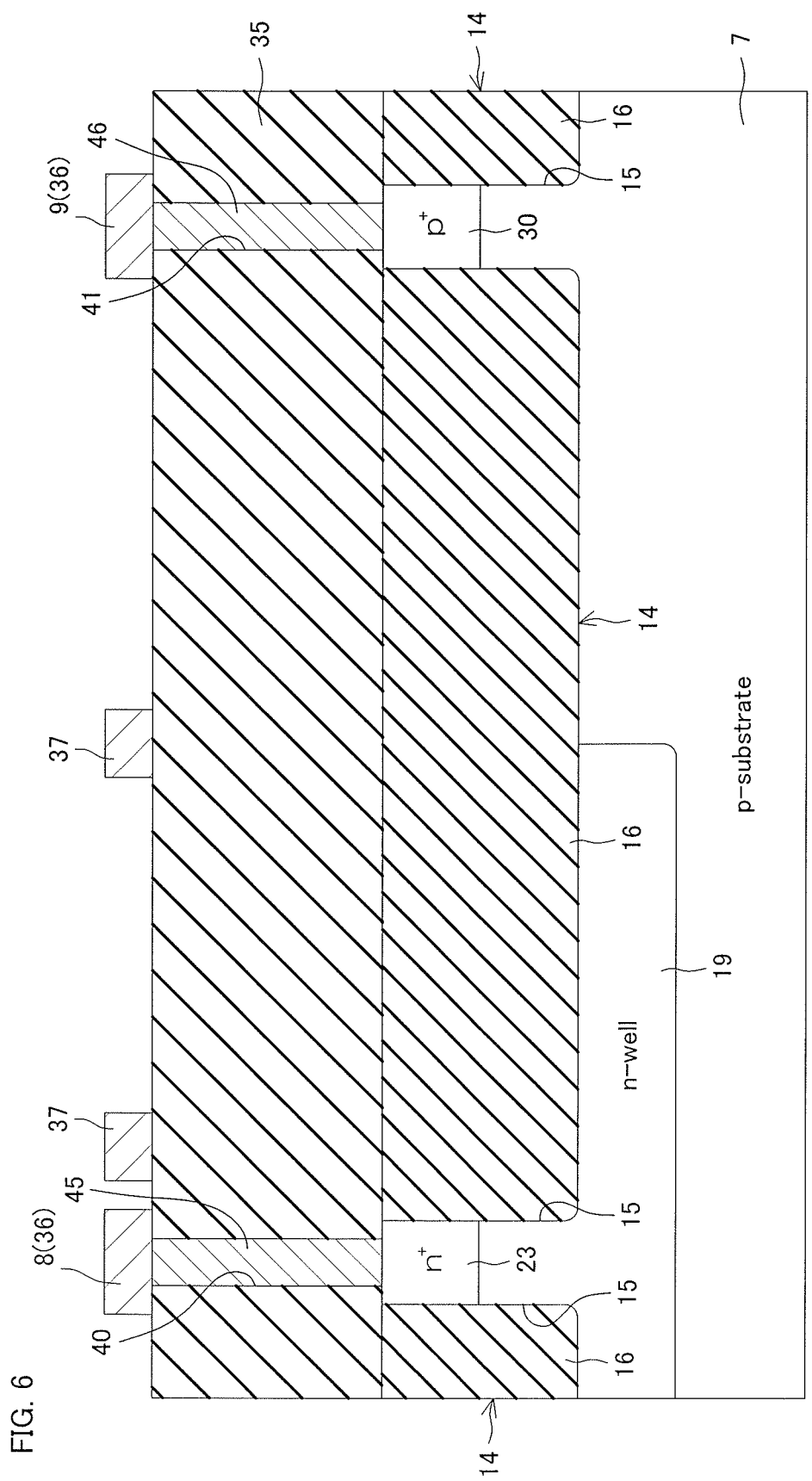
FIG. 6 is a cross-sectional view along line VI-VI of FIG. 3.
Figure 7:
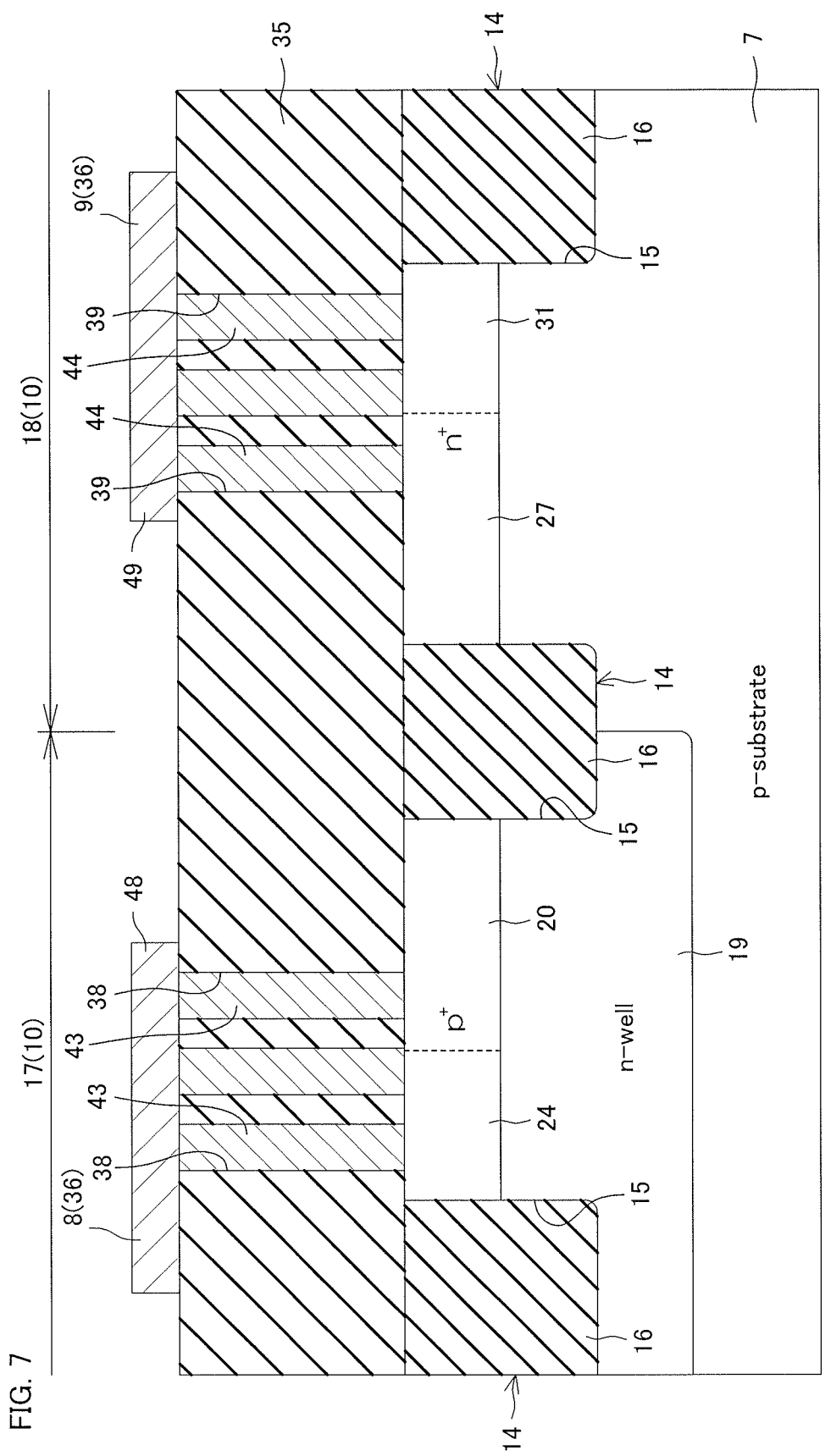
FIG. 7 is a cross-sectional view along line VII-VII of FIG. 3.
Figure 8:
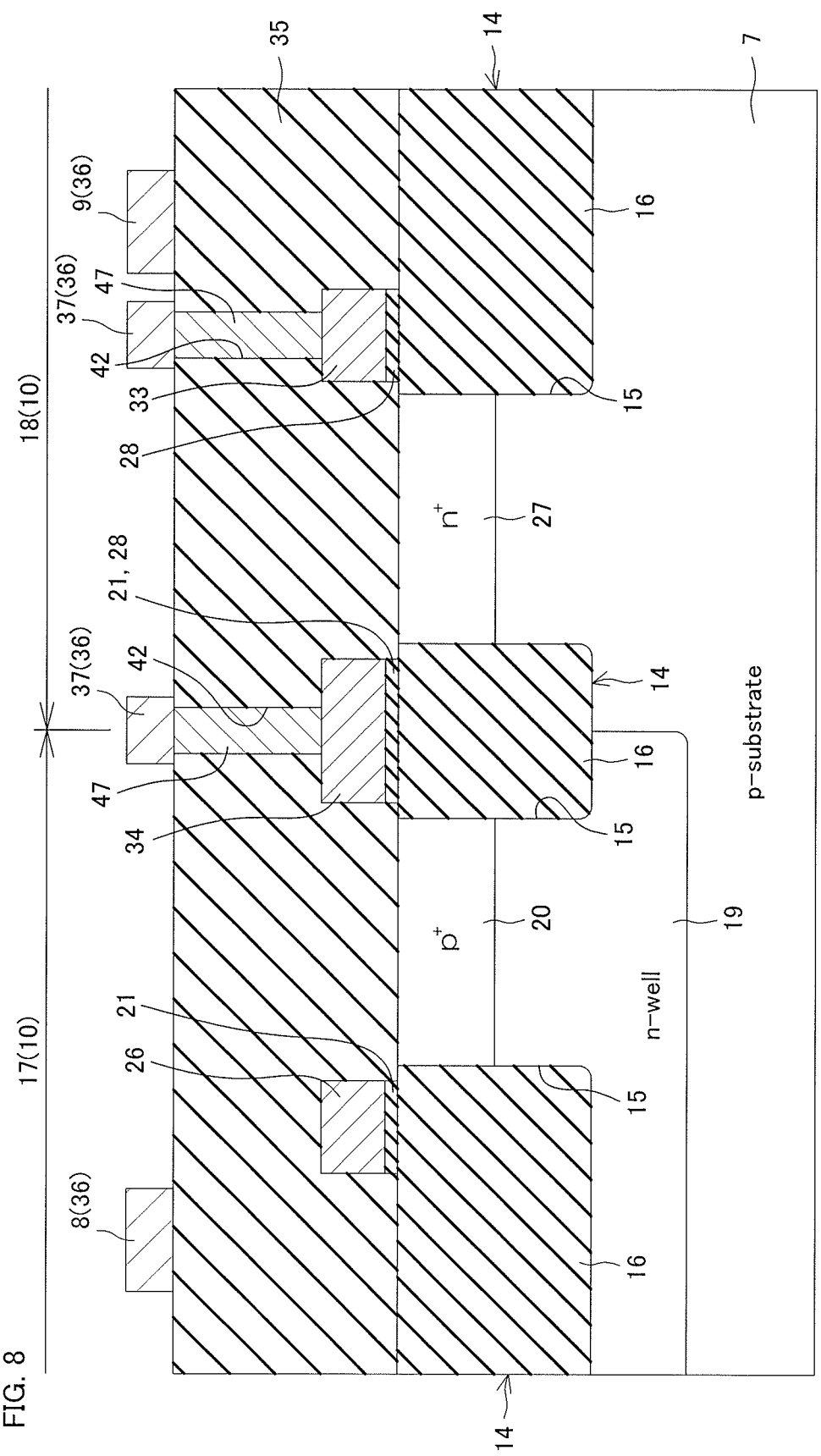
FIG. 8 is a cross-sectional view along line VIII-VIII of FIG. 3.

FIG. 2 is a schematic plan view showing an example (first form) of the layout of basic cells (gate array) that are components of the first circuit cell 4 of the semiconductor integrated circuit device 1. FIG. 3 is an enlarged view of a portion surrounded by an alternate long and two short dashed line III of FIG. 2. FIG. 4 is a cross-sectional view along line IV-IV of FIG. 3. FIG. 5 is a cross-sectional view along line V-V of FIG. 3. FIG. 6 is a cross-sectional view along line VI-VI of FIG. 3. FIG. 7 is a cross-sectional view along line VII-VII of FIG. 3. FIG. 8 is a cross-sectional view along line VIII-VIII of FIG. 3.

In the first circuit cell 4, a first power wiring 8 and a second power wiring 9 are formed on a semiconductor substrate 7 as shown in FIG. 2. One of the first and second power wirings 8 and 9 is a positive wiring (a VDD wiring connected to a plus side of a power source), and the other is a negative wiring (a VSS wiring connected to a minus side of the power source). In the present preferred embodiment, the first power wiring 8 is a positive wiring, and the second power wiring 9 is a negative wiring.

The first power wiring 8 and the second power wiring 9 extend in an X direction that is an example of a first direction of the present invention. The first power wiring 8 and the second power wiring 9 are separated from each other in a Y direction that is an example of a second direction of the present invention that perpendicularly intersects the X direction. Hence, an element disposition region 10 in which a plurality of elements (in the present preferred embodiment, a p-channel type MOSFET 11 and an n-channel type MOSFET 12) are formed is formed between the first power wiring 8 and the second power wiring 9.

In the present preferred embodiment, the first power wiring 8 and the second power wiring 9 each of which is formed in a belt shape extend in the X direction in parallel with each other, and the belt-shaped element disposition region 10 that is wider than the first and second power wirings 8 and 9 is formed between the first power wiring 8 and the second power wiring 9. For example, the width (wiring width) of the first power wiring 8 and that of the second power wiring 9 may be each 0.28 μm to 0.30 μm, and the distance (width $W_1$ of the element disposition region 10) between the first power wiring 8 and the second power wiring 9 may be 3.38 μm to 3.40 μm.

In the element disposition region 10, a plurality of basic cells 13 formed with predetermined patterns are closely arranged in a gate array. Herein, the basic cell 13 is defined as a fundamental unit on layout including a plurality of semiconductor elements. For example, the basic cell 13 may be defined as an aggregation of a plurality of elements (MOSFETs) that are capable of configuring a logic gate (for example, NAND gate, NOR gate, etc.) that serves as a base to form desired logic. In the present preferred embodiment, a configuration consisting of a pair of p-channel type MOSFETs 11 and a pair of n-channel type MOSFETs 12 may be defined as the basic cell 13. The pair of p-channel type MOSFETs 11 and the pair of n-channel type MOSFETs 12 are each formed with a common layout. Additionally, a pattern including a total of four MOSFETs, i.e., including the pair of p-channel type MOSFETs 11 and the pair of n-channel type MOSFETs 12 is set as a basic cell 13, and the plurality of basic cells 13 are arranged along the X direction in the element disposition region 10.

Next, a structure of each of the basic cells 13 will be described in more detail with reference chiefly to FIG. 3 to FIG. 8.

The semiconductor substrate 7 may be made of, for example, a silicon substrate or the like, and, in the present preferred embodiment, the semiconductor substrate 7 is made of a p type silicon substrate.

In the semiconductor substrate 7, an element isolation portion 14 is formed between mutually adjoining basic cells 13 and between the p-channel type MOSFET 11 and the n-channel type MOSFET 12 in each of the basic cells 13. In the present preferred embodiment, the element isolation portion 14 is made of an STI (Shallow Trench Isolation) structure made of an insulating film 16 buried in a trench 15. As a matter of course, the element isolation portion 14 may be made of, for example, a field oxide film, such as LOCOS, without being limited to the STI structure.

The element disposition region 10 is partitioned by the element isolation portion 14 into a first region 17 in which the p-channel type MOSFET 11 is formed and a second region 18 in which the n-channel type MOSFET 12 is formed.

The p-channel type MOSFET 11 includes an n type well 19, a p type diffusion layer 20 that is an example of a first diffusion layer of the present invention, a first gate insulating film 21, a first gate electrode 22, an n type diffusion layer 23 that is an example of a third diffusion layer of the present invention, and a first contact portion 24.

The n type well 19 is formed at a front-surface portion of the semiconductor substrate 7 over the entirety of the first region 17. The n type well 19 is formed more deeply than the element isolation portion 14, and a part of the n type well 19 is formed below the element isolation portion 14.

The p type diffusion layer 20 is formed at a surface portion of the n type well 19, and is exposed from a front surface of the semiconductor substrate 7. The p type diffusion layer 20 has a p type impurity concentration higher than the p type semiconductor substrate 7. Additionally, the number of the p type diffusion layers 20 formed in each of the basic cells 13 is three in the present preferred embodiment. Each of the p type diffusion layers 20 is formed in a rectangular shape whose length in the Y direction is longer than its length in the X direction. For example, the length $W_2$ in the Y direction of each of the p type diffusion layers 20 is 0.95 μm to 1.48 μm.

The three p type diffusion layers 20 are separated from each other in the X direction. Additionally, in the present preferred embodiment, the central p type diffusion layer 20 placed between the p type diffusion layers 20 placed on both sides, respectively, among the three p type diffusion layers 20 has a width larger than the two p type diffusion layers 20 placed on both sides.

One of the mutually-adjoining p type diffusion layers 20 is set as a source of the p-channel type MOSFET 11, and the other is set as a drain of the p-channel type MOSFET 11. Whether it functions as a source or as a drain depends on the pattern of a metal wiring (a wiring on an interlayer insulating film 35 described later) connected to each of the p type diffusion layers 20. With respect to the p-channel type MOSFET 11, the central p type diffusion layer 20 is a diffusion layer connected to the first power wiring 8 (positive wiring) through the first contact portion 24 in the present preferred embodiment, and therefore the central p type diffusion layer 20 may be called a source region. On the other hand, the p type diffusion layers 20 placed on both sides may be each called a drain region.

The first gate insulating film 21 includes a pair of first gate insulating films 21 that are separated from each other. Each of the first gate insulating films 21 is formed in a belt shape that extends in the Y direction, and is formed on a part of the n type well 19 exposed from between the mutually adjoining p type diffusion layers 20. A part of the first gate insulating film 21 overlaps with a peripheral edge portion of the p type diffusion layer 20 as shown in FIG. 4. Hence, the first gate insulating film 21 straddles between the mutually adjoining p type diffusion layers 20. Additionally, the first gate insulating film 21 is made of, for example, an insulating material, such as silicon oxide ($SiO_2$) or silicon nitride (SiN).

The first gate electrode 22 includes a pair of first gate electrodes 22 separated from each other. Each of the first gate electrodes 22 is formed on the first gate insulating film 21, and is formed in the same shape as the first gate insulating film 21. In other words, the first gate electrode 22 is formed in a belt shape that extends in the Y direction, and straddles between the mutually adjoining p type diffusion layers 20. Additionally, the first gate electrode 22 is made of, for example, a conductive material, such as polysilicon.

A portion of the n-type well 19 that faces the first gate electrode 22 is a channel region 25. A channel by which the mutually adjoining p type diffusion layers 20 are electrically connected together is formed. It is possible to form a p type channel in the channel region 25 by applying an appropriate voltage to the first gate electrode 22 in a state in which a potential difference has been generated between the mutually adjoining p type diffusion layers 20.

The first gate electrode 22 additionally includes a first gate contact portion 26. The first gate contact portion 26 is formed on the element isolation portion 14 on the first-power-wiring-8 side with respect to the p type diffusion layer 20 as shown in FIG. 3 and FIG. 8. The first gate contact portion 26 is formed more widely than a part of the first gate electrode 22 on the channel region 25. More specifically, the first gate contact portion 26 is formed in such a manner as to protrude outwardly (toward the side separated from the first contact portion 24) with respect to the first gate electrode 22 on the channel region 25 in the X direction. Additionally, the first gate insulating film 21 is interposed between the first gate contact portion 26 and the element isolation portion 14.

The n type diffusion layer 23 is a diffusion layer for backgates to take a substrate potential in the p-channel type MOSFET 11, and has an n type impurity concentration higher than the n type well 19.

The n type diffusion layer 23 is formed at a surface portion of the n type well 19 below the first power wiring 8 as shown in FIG. 3 and FIG. 6, and is placed in a dotted manner along the X direction. In other words, the plurality of n type diffusion layers 23 are orderly arranged along the first power wiring 8 with intervals between the n type diffusion layers 23. In the present preferred embodiment, the n type diffusion layer 23 is formed at a boundary portion between the mutually adjoining basic cells 13, and the n type diffusion layer 23 is shared between the mutually adjoining basic cells 13. Therefore, in each of the basic cells 13, a region that is below the first power wiring 8 and that faces the p type diffusion layer 20 in the Y direction is a region in which the n type diffusion layer 23 is not formed.

The first contact portion 24 selectively extends from the p type diffusion layer 20 toward a region below the first power wiring 8 in which the n type diffusion layer 23 is not formed. Hence, a forward end portion 50 of the first contact portion 24 faces the first power wiring 8 in a thickness direction of the semiconductor substrate 7. In the present preferred embodiment, the first contact portion 24 selectively extends from the p type diffusion layer 20 (central p type diffusion layer 20) between the pair of first gate electrodes 22, and the first contact portion 24 is not connected to the p type diffusion layers 20 on both sides of the pair of first gate electrodes 22. On the other hand, the region below the first power wiring 8 in which the n type diffusion layer 23 is not formed is formed of the element isolation portion 14 except the forward end portion 50 of the first contact portion 24.

The first contact portion 24 is a p type diffusion layer formed integrally with the p type diffusion layer 20, and can be produced by the same ion implantation step as the p type diffusion layer 20. The p type impurity concentration of the first contact portion 24 may be the same as the p type impurity concentration of the p type diffusion layer 20.

Additionally, the first contact portion 24 may be narrower than the p type diffusion layer 20 as shown in FIG. 3, and, for example, may be formed so as to have such a width as not to overlap with the first gate electrode 22 in a plan view.

The basic gate pattern of the n-channel type MOSFET 12 is line-symmetrical with the basic gate pattern of the p-channel type MOSFET 11 when an axis A on the element isolation portion 14 that extends in the X direction between the p-channel type MOSFET 11 and the n-channel type MOSFET 12 as shown in FIG. 3 is defined as a symmetrical axis.

More specifically, the n-channel type MOSFET 12 includes an n type diffusion layer 27 that is an example of a second diffusion layer of the present invention, a second gate insulating film 28, a second gate electrode 29, a p type diffusion layer 30 that is an example of a third diffusion layer of the present invention, and a second contact portion 31.

The n type diffusion layer 27 is formed at the front-surface portion of the semiconductor substrate 7, and is exposed from the front surface of the semiconductor substrate 7. The n type diffusion layer 27 has an n type impurity concentration higher than the p type semiconductor substrate 7. Additionally, the number of the n type diffusion layers 27 formed in each of the basic cells 13 is three in the present preferred embodiment. Each of the n type diffusion layers 27 is formed in a rectangular shape whose length in the Y direction is longer than its length in the X direction. For example, the length $W_3$ in the Y direction of each of the n type diffusion layers 27 is 0.81 μm to 1.34 μm.

The three n type diffusion layers 27 are separated from each other in the X direction. Additionally, in the present preferred embodiment, the central n type diffusion layer 27 placed between the n type diffusion layers 27 placed on both sides, respectively, among the three n type diffusion layers 27 has a width larger than the two n type diffusion layers 27 placed on both sides.

One of the mutually-adjoining n type diffusion layers 27 is set as a source of the n-channel type MOSFET 12, and the other is set as a drain of the n-channel type MOSFET 12. Whether it functions as a source or as a drain depends on the pattern of a metal wiring (a wiring on the interlayer insulating film 35 described later) connected to each of the n type diffusion layers 27. With respect to the n-channel type MOSFET 12, the central n type diffusion layer 27 is a diffusion layer connected to the second power wiring 9 (negative wiring) through the second contact portion 31 in the present preferred embodiment, and therefore the central n type diffusion layer 27 may be called a source region. On the other hand, the n type diffusion layers 27 placed on both sides may be each called a drain region.

The second gate insulating film 28 includes a pair of second gate insulating films 28 that are separated from each other. Each of the second gate insulating films 28 is formed in a belt shape that extends in the Y direction, and is formed on the semiconductor substrate 7. A part of the second gate insulating film 28 overlaps with a peripheral edge portion of the n type diffusion layer 27 as shown in FIG. 5. Hence, the second gate insulating film 28 straddles between the mutually adjoining n type diffusion layers 27. Additionally, the second gate insulating film 28 is made of, for example, an insulating material, such as silicon oxide ($SiO_2$) or silicon nitride (SiN).

The second gate electrode 29 includes a pair of second gate electrodes 29 separated from each other. Each of the second gate electrodes 29 is formed on the second gate insulating film 28, and is formed in the same shape as the second gate insulating film 28. In other words, the second gate electrode 29 is formed in a belt shape that extends in the Y direction, and straddles between the mutually adjoining n type diffusion layers 27. Additionally, the second gate electrode 29 is made of, for example, a conductive material, such as polysilicon.

A portion of the semiconductor substrate 7 that faces the second gate electrode 29 is a channel region 32. A channel by which the mutually adjoining n type diffusion layers 27 are electrically connected together is formed. It is possible to form an n type channel in the channel region 32 by applying an appropriate voltage to the second gate electrode 29 in a state in which a potential difference has been generated between the mutually adjoining n type diffusion layers 27.

The second gate electrode 29 additionally includes a second gate contact portion 33. The second gate contact portion 33 is formed on the element isolation portion 14 on the second-power-wiring-9 side with respect to the n type diffusion layer 27 as shown in FIG. 3 and FIG. 8. The second gate contact portion 33 is formed more widely than a part of the second gate electrode 29 on the channel region 32. More specifically, the second gate contact portion 33 is formed in such a manner as to protrude outwardly (toward the side separated from the second contact portion 31) with respect to the second gate electrode 29 on the channel region 32 in the X direction. Additionally, the second gate insulating film 28 is interposed between the second gate contact portion 33 and the element isolation portion 14.

In the present preferred embodiment, an end on the second-power-wiring-9 side of the first gate electrode 22 and an end on the first-power-wiring-8 side of the second gate electrode 29 are connected integrally with each other, and a shared gate contact portion 34 is formed. The gate contact portion 34 is formed more widely than the first gate contact portion 26 and the second gate contact portion 33.

More specifically, the gate contact portion 34 is formed in such a manner as to protrude toward both sides with respect to the first gate electrode 22 and the second gate electrode 29 in the X direction. The amount of protrusion of a part of the gate contact portion 34 that protrudes inwardly (toward the side approaching the first contact portion 24 and the second contact portion 31) with respect to the first gate electrode 22 and the second gate electrode 29 is smaller than the amount of protrusion of the gate contact portion 34 that protrudes toward its opposite side.

The p type diffusion layer 30 is a diffusion layer for backgates to take a substrate potential in the n-channel type MOSFET 12, and has a p type impurity concentration higher than the p type semiconductor substrate 7.

The p type diffusion layer 30 is formed at the front-surface portion of the semiconductor substrate 7 below the second power wiring 9 as shown in FIG. 3 and FIG. 6, and is placed in a dotted manner along the X direction. In other words, the plurality of p type diffusion layers 30 are orderly arranged along the second power wiring 9 with intervals between the p type diffusion layers 30. In the present preferred embodiment, the p type diffusion layer 30 is formed at the boundary portion between the mutually adjoining basic cells 13, and the p type diffusion layers 30 is shared between the mutually adjoining basic cells 13. Therefore, in each of the basic cells 13, a region that is below the second power wiring 9 and that faces the n type diffusion layer 27 in the Y direction is a region in which the p type diffusion layer 30 is not formed.

The single pair of n type diffusion layers 23 are respectively formed at both corner portions of the upper side of the basic cell 13, and the single pair of p type diffusion layers 30 are respectively formed at both corner portions of the lower side of the basic cell 13 as shown in FIG. 3. Therefore, in the first circuit cell 4 of the semiconductor integrated circuit device 1, the diffusion layers for backgates are respectively formed at the four corners of the basic cell 13.

The second contact portion 31 selectively extends from the n type diffusion layer 27 toward a region below the second power wiring 9 in which the p type diffusion layer 30 is not formed. Hence, a forward end portion 51 of the second contact portion 31 faces the second power wiring 9 in the thickness direction of the semiconductor substrate 7. In the present preferred embodiment, the second contact portion 31 selectively extends from the n type diffusion layer 27 (central n type diffusion layer 27) between the pair of second gate electrodes 29, and the second contact portion 31 is not connected to the n type diffusion layers 27 on both sides of the pair of second gate electrodes 29. On the other hand, the region below the second power wiring 9 in which the p type diffusion layer 30 is not formed is formed of the element isolation portion 14 except the forward end portion 51 of the second contact portion 31.

The second contact portion 31 is an n type diffusion layer formed integrally with the n type diffusion layer 27, and can be produced by the same ion implantation step as the n type diffusion layer 27. The n type impurity concentration of the second contact portion 31 may be the same as the n type impurity concentration of the n type diffusion layer 27.

Additionally, the second contact portion 31 may be narrower than the n type diffusion layer 27 as shown in FIG. 3, and, for example, may be formed so as to have such a width as not to overlap with the second gate electrode 29 in a plan view.

An interlayer insulating film 35 is stacked on the semiconductor substrate 7 so as to cover the first gate electrode 22 and the second gate electrode 29. The interlayer insulating film 35 is made of, for example, an insulating material, such as silicon oxide ($SiO_2$).

A wiring pattern 36 is formed on the interlayer insulating film 35. The wiring pattern 36 is formed of, for example, a metal wiring, such as an aluminum wiring. The wiring pattern 36 may include a circuit wiring 37 that is connected to the first gate electrode 22, to the second gate electrode 29, to the p type diffusion layer 20, to the n type diffusion layer 27, and so on, in addition to the first power wiring 8 and the second power wiring 9.

The pattern of the circuit wiring 37 is appropriately changed in accordance with a designed digital circuit. In the present preferred embodiment, only an aspect in which the circuit wiring 37 is connected to the first gate contact portion 26, to the second gate contact portion 33, and to the gate contact portion 34 is shown as an example as shown in FIG. 3.

Additionally, a first contact hole 38, a second contact hole 39, a third contact hole 40, a fourth contact hole 41, and a fifth contact hole 42 are formed in the interlayer insulating film 35.

The first contact portion 24 is electrically connected to a first branch wiring 48 that branches from the first power wiring 8 through a via 43 (for example, tungsten (W)) buried in the first contact hole 38 as shown in FIG. 7. The first branch wiring 48 perpendicularly branches from the first power wiring 8, and extends in parallel with the first contact portion 24. In the present preferred embodiment, a plurality of first contact holes 38 (three in FIG. 3) are formed below the first branch wiring 48. The plurality of first contact holes 38 are arranged with intervals between the first contact holes 38 along a direction along which the first branch wiring 48 extends.

The second contact portion 31 is electrically connected to a second branch wiring 49 that branches from the second power wiring 9 through a via 44 (for example, tungsten (W)) buried in the second contact hole 39. The second branch wiring 49 perpendicularly branches from the second power wiring 9, and extends in parallel with the second contact portion 31. In the present preferred embodiment, a plurality of second contact holes 39 (three in FIG. 3) are formed below the second branch wiring 49. The plurality of second contact holes 39 are arranged with intervals between the second contact holes 39 along a direction along which the second branch wiring 49 extends.

The n type diffusion layer 23 of the p-channel type MOSFET 11 is electrically connected to the first power wiring 8 through a via 45 (for example, tungsten (W)) buried in the third contact hole 40 as shown in FIG. 6. The p type diffusion layer 30 of the n-channel type MOSFET 12 is electrically connected to the second power wiring 9 through a via 46 (for example, tungsten (W)) buried in the fourth contact hole 41.

The first gate contact portion 26, the second gate contact portion 33, and the gate contact portion 34 are electrically connected to the circuit wiring 37 through a via 47 (for example, tungsten (W)) buried in the fifth contact hole 42 as shown in FIG. 3 and FIG. 8.

As described above, according to this semiconductor integrated circuit device 1, the element disposition region 10 (the first region 17 and second region 18) of both the p-channel type MOSFET 11 and the n-channel type MOSFET 12 is formed in a region between the first power wiring 8 and the second power wiring 9. Therefore, the first power wiring 8 and the second power wiring 9 are not formed in the basic cell 13.

This makes it possible to use the space of the inside of the basic cell 13 for the layout of other wirings (for example, the circuit wiring 37 of FIG. 3), thus making it possible to improve a wiring capability in the basic cell 13. As a result, room is generated in the space for wiring layout, and therefore it is possible to shorten the length of the basic cell 13 including the p-channel type MOSFET 11 and the n-channel type MOSFET 12 in the Y direction. For example, it is possible to set the length $W_2$ of the p type diffusion layer 20 and the length $W_3$ of the n type diffusion layer 27 in the Y direction at 0.81 μm to 0.95 μm, respectively.

Additionally, the n type diffusion layer 23 and the p type diffusion layer 30 for backgates are formed below the first power wiring 8 and the second power wiring 9, respectively, and are arranged in a dotted manner along the X direction. This makes it possible to effectively use a region that is located below the first power wiring 8 and the second power wiring 9 and in which the n type diffusion layer 23 and the p type diffusion layer 30 are not formed.

For example, it is possible to effectively use a neighborhood of a region that is located below the first power wiring 8 and in which the n type diffusion layer 23 is not formed as the first contact portion 24 for supplying electric power to the p type diffusion layer 20 as shown in FIG. 3. This makes it possible to further improve a wiring capability in the basic cell 13 because a wiring (the first branch wiring 48) for supplying electric power to the p type diffusion layer 20 is not required to be long drawn around in the basic cell 13 (in the first region 17) and because it is only necessary to allow the wiring to slightly branch from the first power wiring 8.

Additionally, for example, it is possible to effectively use a neighborhood of a region that is located below the second power wiring 9 and in which the p type diffusion layer 30 is not formed as the second contact portion 31 for supplying electric power to the n type diffusion layer 27 as shown in FIG. 3. This makes it possible to further improve a wiring capability in the basic cell 13 because a wiring (the second branch wiring 49) for supplying electric power to the n type diffusion layer 27 is not required to be long drawn around in the basic cell 13 (in the second region 18) and because it is only necessary to allow the wiring to slightly branch from the second power wiring 9.

Additionally, the gate contact portion 34 enables a gate electrode to be shared between the p-channel type MOSFET 11 and the n-channel type MOSFET 12. This makes it possible to reduce wirings that are connected to the first gate electrode 22 and to the second gate electrode 29. As a result, the flexibility of wiring in the basic cell 13 can be improved, and therefore it is possible to further improve a wiring capability in the basic cell 13.

Figure 9:
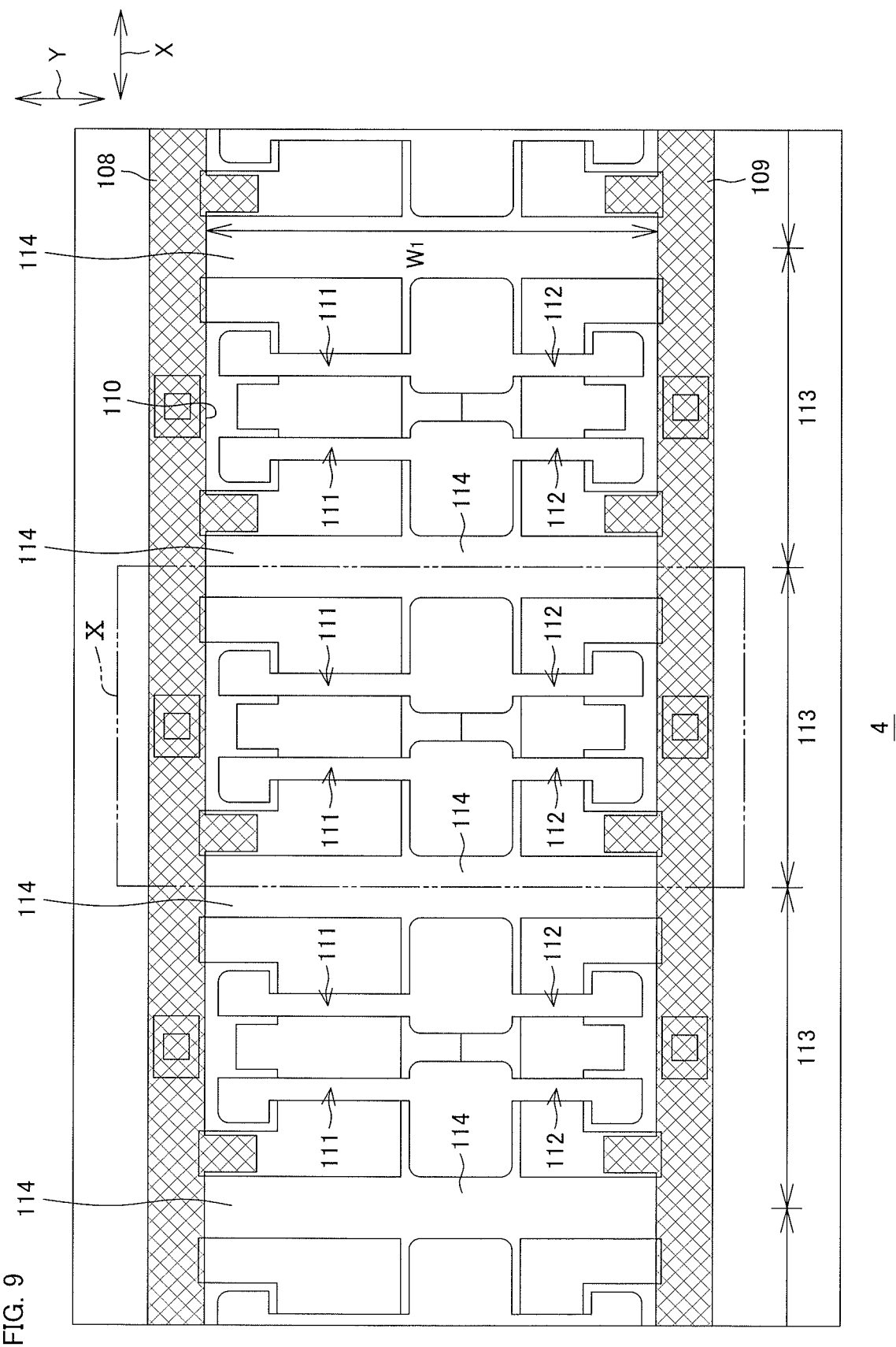
FIG. 9 is a schematic plan view showing an example (second form) of the layout of basic cells (gate array) that are components of the semiconductor integrated circuit device according to the preferred embodiment of the present invention.
Figure 10:
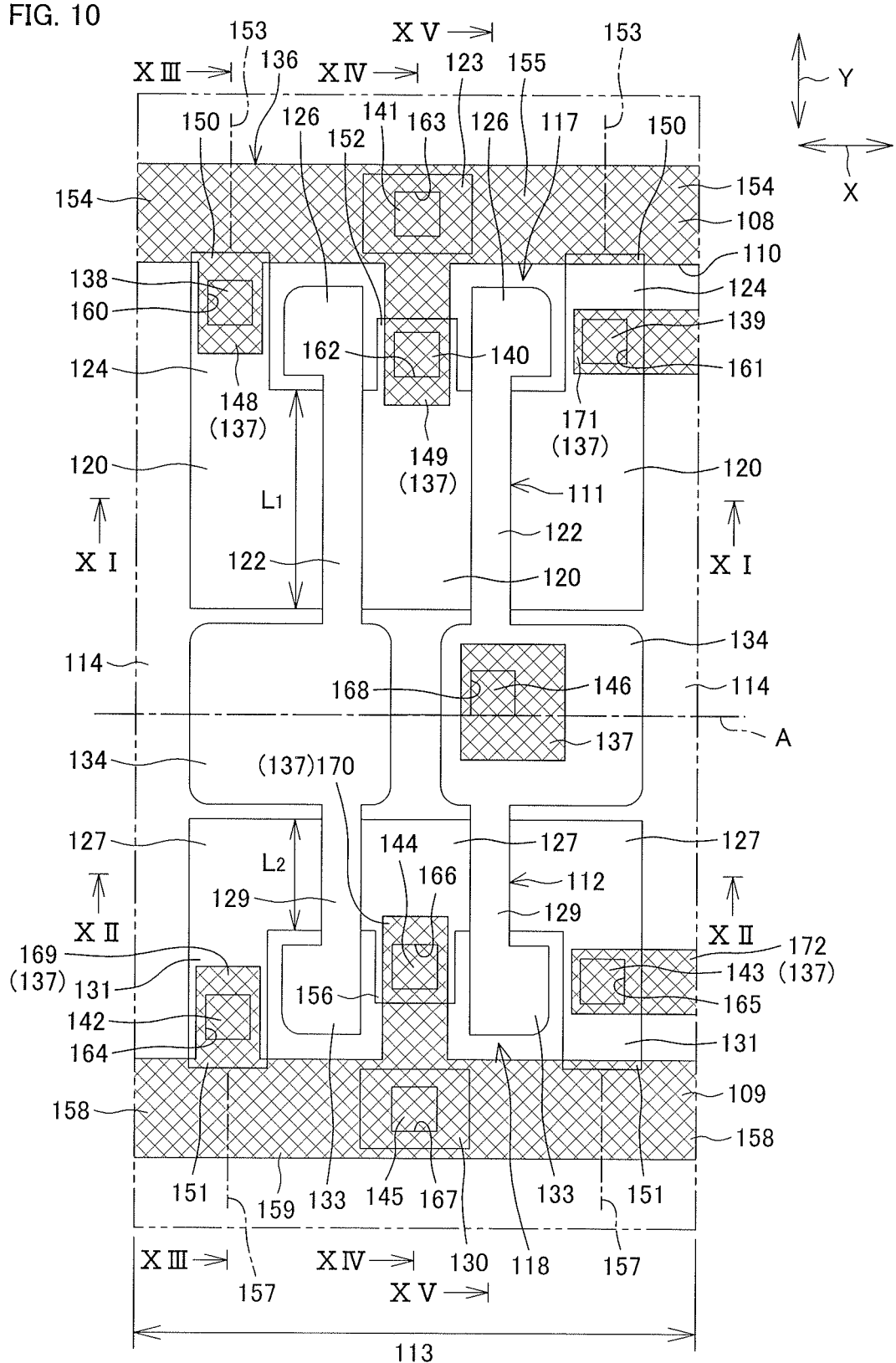
FIG. 10 is an enlarged view of a portion surrounded by an alternate long and two short dashed line X of FIG. 9.
Figure 11:
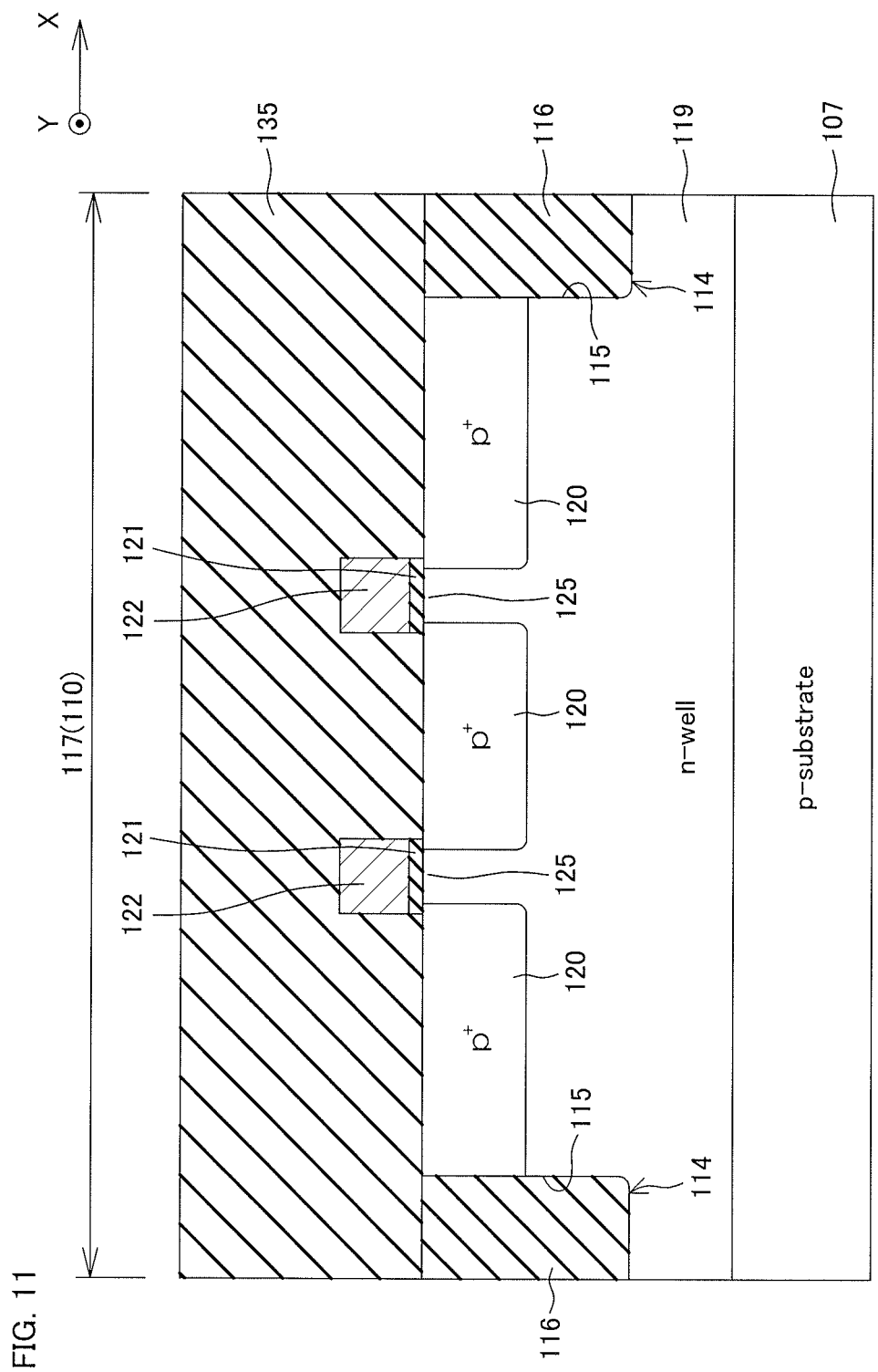
FIG. 11 is a cross-sectional view along line XI-XI of FIG. 10.
Figure 12:
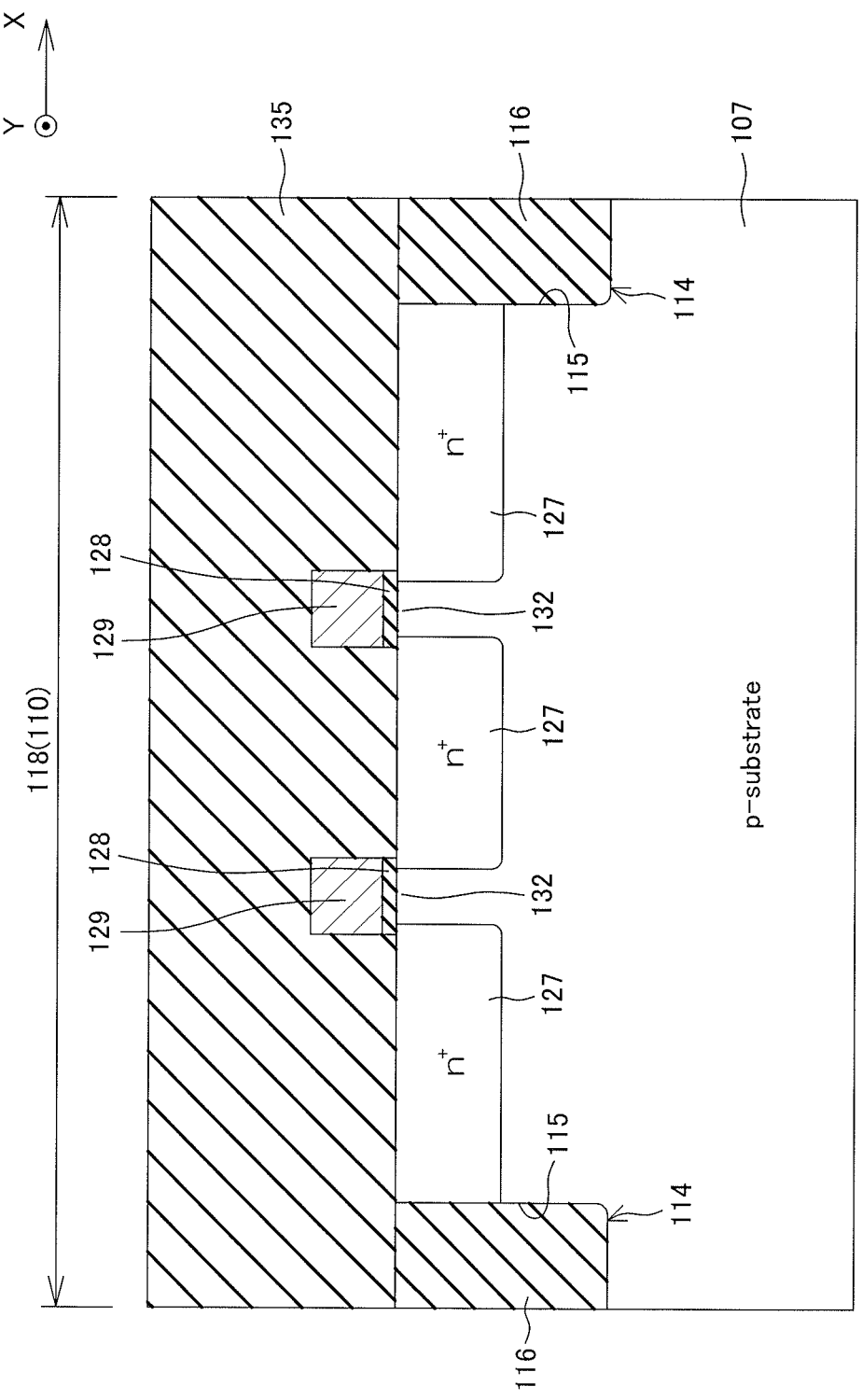
FIG. 12 is a cross-sectional view along line XII-XII of FIG. 10.
Figure 13:
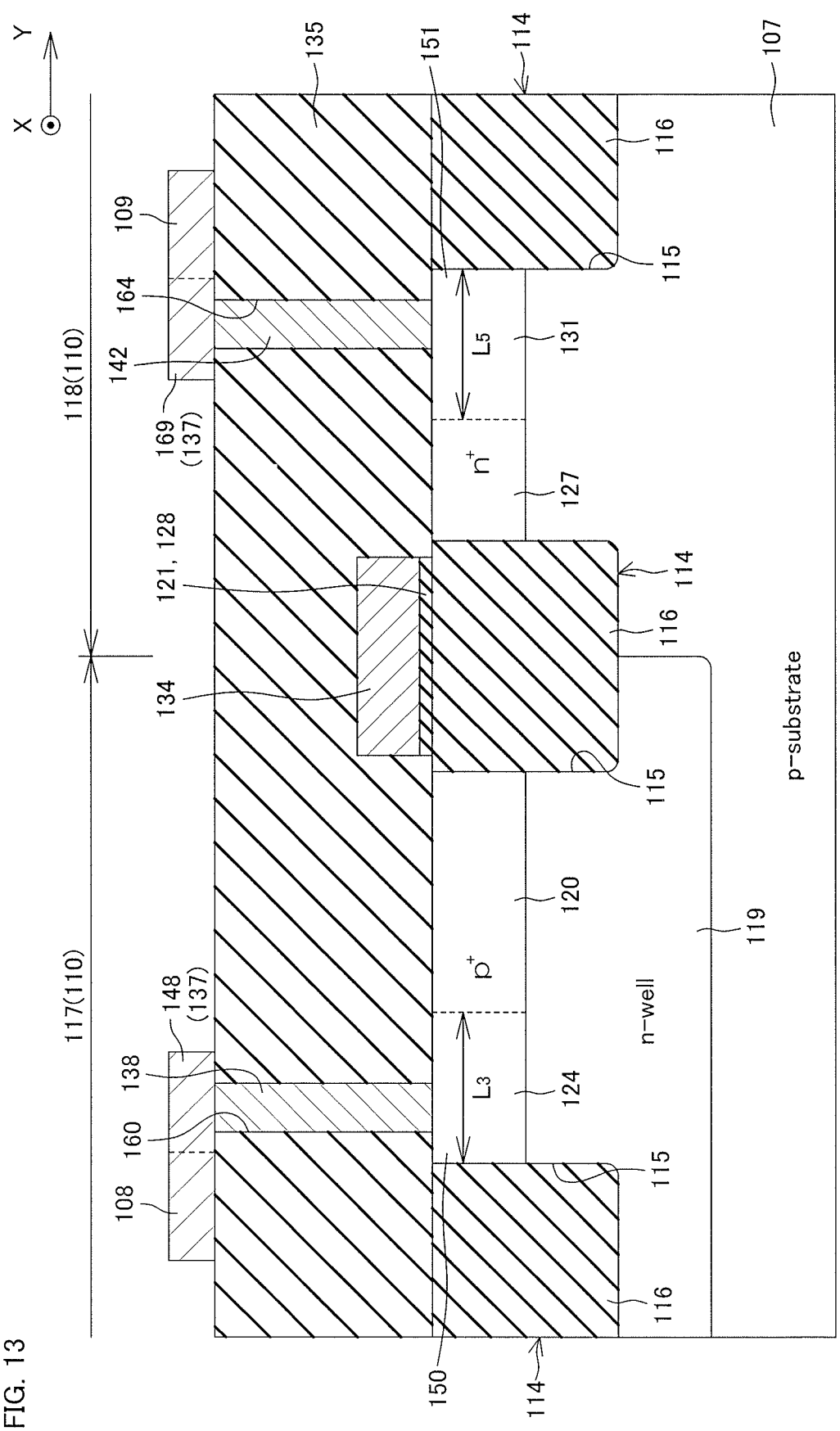
FIG. 13 is a cross-sectional view along line XIII-XIII of FIG. 10.
Figure 14:
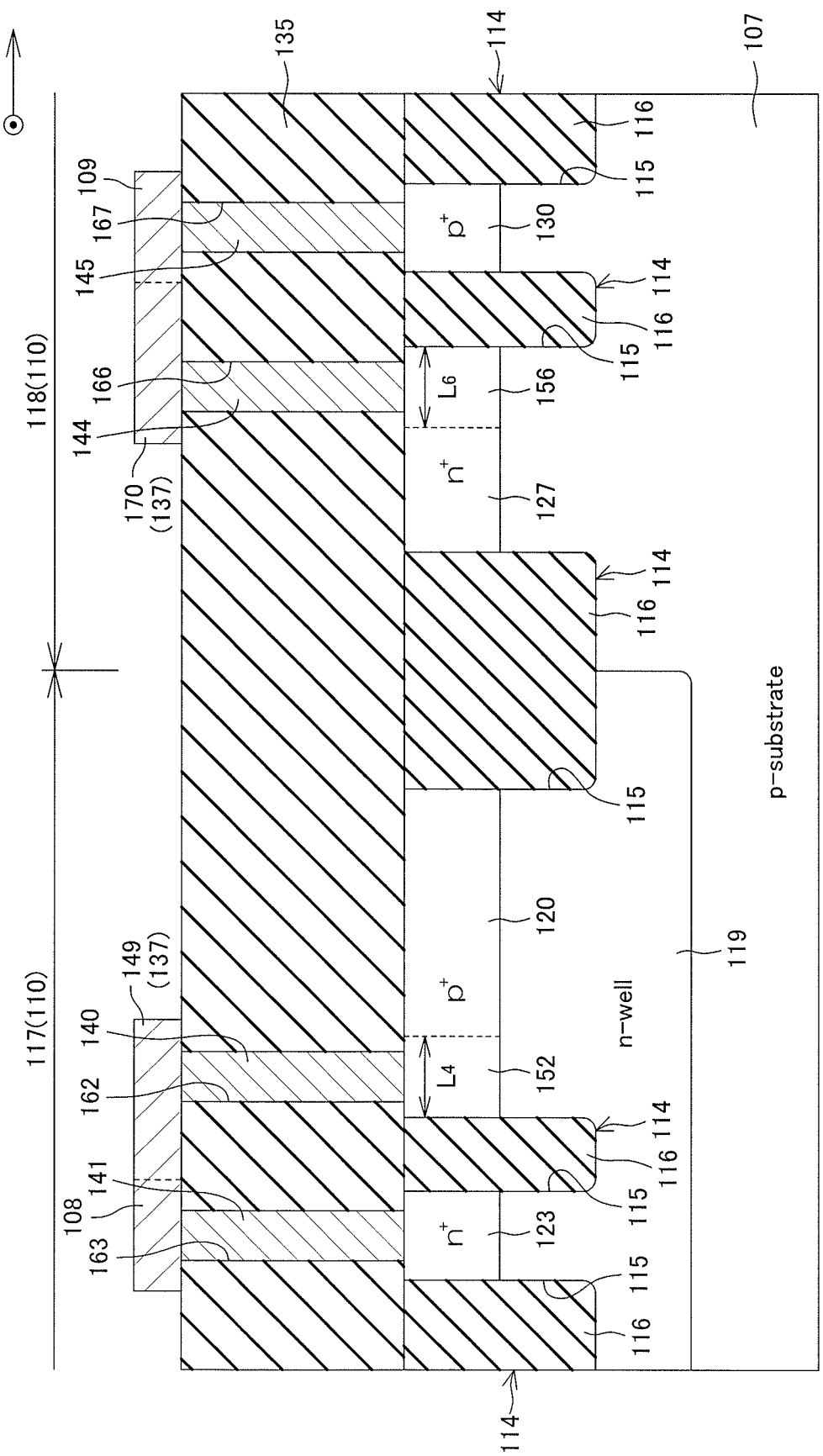
FIG. 14 is a cross-sectional view along line XIV-XIV of FIG. 10.
Figure 15:
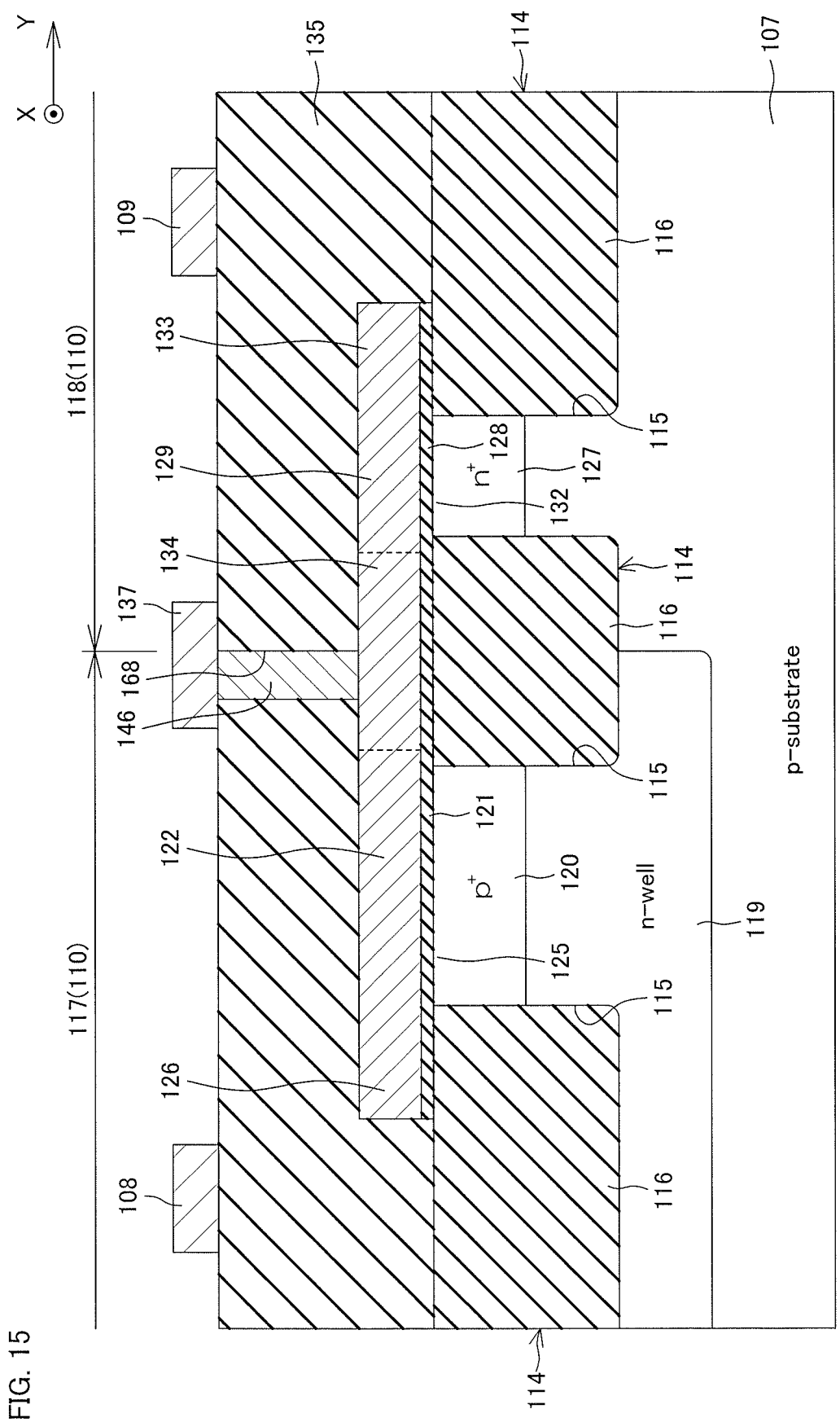
FIG. 15 is a cross-sectional view along line XV-XV of FIG. 10.

FIG. 9 is a schematic plan view showing an example (second form) of the layout of basic cells (gate array) that are components of the first circuit cell 4 of the semiconductor integrated circuit device 1. FIG. 10 is an enlarged view of a portion surrounded by an alternate long and two short dashed line X of FIG. 9. FIG. 11 is a cross-sectional view along line XI-XI of FIG. 10. FIG. 12 is a cross-sectional view along line XII-XII of FIG. 10. FIG. 13 is a cross-sectional view along line XIII-XIII of FIG. 10. FIG. 14 is a cross-sectional view along line XIV-XIV of FIG. 10. FIG. 15 is a cross-sectional view along line XV-XV of FIG. 10.

In the first circuit cell 4, a first power wiring 108 and a second power wiring 109 are formed on a semiconductor substrate 107 as shown in FIG. 9. One of the first and second power wirings 108 and 109 is a positive wiring (a VDD wiring connected to a plus side of a power source), and the other is a negative wiring (a VSS wiring connected to a minus side of the power source). In the present preferred embodiment, the first power wiring 108 is a positive wiring, and the second power wiring 109 is a negative wiring.

The first power wiring 108 and the second power wiring 109 extend in an X direction that is an example of a first direction of the present invention. The first power wiring 108 and the second power wiring 109 are separated from each other in a Y direction that is an example of a second direction of the present invention that perpendicularly intersects the X direction. Hence, an element disposition region 110 in which a plurality of elements (in the present preferred embodiment, a p-channel type MOSFET 111 and an n-channel type MOSFET 112) are formed is formed between the first power wiring 108 and the second power wiring 109.

In the present preferred embodiment, the first power wiring 108 and the second power wiring 109 each of which is formed in a belt shape extend in the X direction in parallel with each other, and the belt-shaped element disposition region 110 that is wider than the first and second power wirings 108 and 109 is formed between the first power wiring 108 and the second power wiring 109. For example, the width (wiring width) of the first power wiring 108 and that of the second power wiring 109 may be each 0.39 μm to 0.41 μm, and the distance (width $W_1$ of the element disposition region 110) between the first power wiring 108 and the second power wiring 109 may be 4.07 μm to 4.09 μm.

In the element disposition region 110, a plurality of basic cells 113 formed with predetermined patterns are closely arranged in a gate array. Herein, the basic cell 113 is defined as a fundamental unit on layout including a plurality of semiconductor elements. For example, the basic cell 113 may be defined as an aggregation of a plurality of elements (MOSFETs) that are capable of configuring a logic gate (for example, NAND gate, NOR gate, etc.) that serves as a base to form desired logic. In the present preferred embodiment, a configuration consisting of a pair of p-channel type MOSFETs 111 and a pair of n-channel type MOSFETs 112 may be defined as the basic cell 113. The pair of p-channel type MOSFETs 111 and the pair of n-channel type MOSFETs 112 are each formed with a common layout. Additionally, a pattern including a total of four MOSFETs, i.e., including the pair of p-channel type MOSFETs 111 and the pair of n-channel type MOSFETs 112 is set as a basic cell 113, and the plurality of basic cells 113 are arranged along the X direction in the element disposition region 110.

Next, a structure of each of the basic cells 113 will be described in more detail with reference chiefly to FIG. 10 to FIG. 15.

The semiconductor substrate 107 may be made of, for example, a silicon substrate or the like, and, in the present preferred embodiment, the semiconductor substrate 107 is made of a p type silicon substrate.

In the semiconductor substrate 107, an element isolation portion 114 is formed between mutually adjoining basic cells 113 and between the p-channel type MOSFET 111 and the n-channel type MOSFET 112 in each of the basic cells 113. In the present preferred embodiment, the element isolation portion 114 is made of an STI (Shallow Trench Isolation) structure made of an insulating film 116 buried in a trench 115. As a matter of course, the element isolation portion 114 may be made of, for example, a field oxide film, such as LOCOS, without being limited to the STI structure.

The element disposition region 110 is partitioned by the element isolation portion 114 into a first region 117 in which the p-channel type MOSFET 111 is formed and a second region 118 in which the n-channel type MOSFET 112 is formed.

The p-channel type MOSFET 111 includes an n type well 119, a p type diffusion layer 120 that is an example of a first diffusion layer of the present invention, a first gate insulating film 121, a first gate electrode 122, an n type diffusion layer 123 that is an example of a third diffusion layer of the present invention, and a first contact portion 124.

The n type well 119 is formed at a front-surface portion of the semiconductor substrate 107 over the entirety of the first region 117. The n type well 119 is formed more deeply than the element isolation portion 114, and a part of the n type well 119 is formed below the element isolation portion 114.

The p type diffusion layer 120 is formed at a surface portion of the n type well 119, and is exposed from a front surface of the semiconductor substrate 107. The p type diffusion layer 120 has a p type impurity concentration higher than the p type semiconductor substrate 107. Additionally, the number of the p type diffusion layers 120 formed in each of the basic cells 113 is three in the present preferred embodiment. Each of the p type diffusion layers 120 is formed in a rectangular shape whose length in the X direction is longer than its length in the Y direction. For example, the length $L_1$ in the Y direction of each of the p type diffusion layers 120 is 1.14 μm to 1.86 μm.

The three p type diffusion layers 120 are separated from each other in the X direction (see FIG. 11). Additionally, in the present preferred embodiment, the central p type diffusion layer 120 placed between the p type diffusion layers 120 placed on both sides, respectively, among the three p type diffusion layers 120 has a width smaller than the two p type diffusion layers 120 placed on both sides.

One of the mutually-adjoining p type diffusion layers 120 is set as a source of the p-channel type MOSFET 111, and the other is set as a drain of the p-channel type MOSFET 111. Whether it functions as a source or as a drain depends on the pattern of a metal wiring (a wiring on an interlayer insulating film 135 described later) connected to each of the p type diffusion layers 120. With respect to the p-channel type MOSFET 111, one (the left-side one in the plane of paper of FIG. 10) of the two p type diffusion layers 120 placed on both sides is a diffusion layer connected to the first power wiring 108 (positive wiring) through the first contact portion 124 in the present preferred embodiment, and therefore the left-side one may be called a source region. On the other hand, the other one (the right-side one in the plane of paper of FIG. 10) of the two p type diffusion layers 120 placed on both sides may be called a drain region.

The first gate insulating film 121 includes a pair of first gate insulating films 121 that are separated from each other. Each of the first gate insulating films 121 is formed in a belt shape that extends in the Y direction, and is formed on a part of the n type well 119 exposed from between the mutually adjoining p type diffusion layers 120. A part of the first gate insulating film 121 overlaps with a peripheral edge portion of the p type diffusion layer 120 as shown in FIG. 11. Hence, the first gate insulating film 121 straddles between the mutually adjoining p type diffusion layers 120. Additionally, the first gate insulating film 121 is made of, for example, an insulating material, such as silicon oxide ($SiO_2$) or silicon nitride (SiN).

The first gate electrode 122 includes a pair of first gate electrodes 122 separated from each other. Each of the first gate electrodes 122 is formed on the first gate insulating film 121, and is formed in the same shape as the first gate insulating film 121. In other words, the first gate electrode 122 is formed in a belt shape that extends in the Y direction, and straddles between the mutually adjoining p type diffusion layers 120. Additionally, the first gate electrode 122 is made of, for example, a conductive material, such as polysilicon.

A portion of the n type well 119 that faces the first gate electrode 122 is a channel region 125. A channel by which the mutually adjoining p type diffusion layers 120 are electrically connected together is formed. It is possible to form a p type channel in the channel region 125 by applying an appropriate voltage to the first gate electrode 122 in a state in which a potential difference has been generated between the mutually adjoining p type diffusion layers 120.

The first gate electrode 122 additionally includes a first gate contact portion 126. The first gate contact portion 126 is formed on the element isolation portion 114 on the first-power-wiring-108 side with respect to the p type diffusion layer 120 as shown in FIG. 10 and FIG. 15. The first gate contact portion 126 is formed more widely than a part of the first gate electrode 122 on the channel region 125. More specifically, the first gate contact portion 126 is formed in such a manner as to protrude outwardly (toward the side approaching the first contact portion 124) with respect to the first gate electrode 122 on the channel region 125 in the X direction. Additionally, the first gate insulating film 121 is interposed between the first gate contact portion 126 and the element isolation portion 114.

The first contact portion 124 selectively extends from the p type diffusion layer 120 toward a region below the first power wiring 108. Hence, a forward end portion 150 of the first contact portion 124 faces the first power wiring 108 in a thickness direction of the semiconductor substrate 107. In other words, the forward end portion 150 of the first contact portion 124 overlaps with the first power wiring 108 in a plan view. It should be noted that the forward end portion 150 of the first contact portion 124 is not necessarily required to overlap with the first power wiring 108 in a plan view. Whether the forward end portion 150 of the first contact portion 124 is allowed to overlap with the first power wiring 108 or not can be appropriately determined on the basis of a design rule, such as line-and-space (L/S), for example.

In the present preferred embodiment, the first contact portion 124 selectively extends from the p type diffusion layers 120 (the two p type diffusion layers 120 on both sides) placed on both sides (outside) of the single pair of first gate electrodes 122 in the X direction. On the other hand, a first extension portion 152 whose length in the Y direction is shorter than the first contact portion 124 is connected to the p type diffusion layer 120 placed between the single pair of first gate electrodes 122. For example, the ratio ($L_4/L_3$) of the length $L_4$ in the Y direction of the first extension portion 152 (see FIG. 14) to the length $L_3$ in the Y direction of the first contact portion 124 (see FIG. 13) may be 0.50 to 0.52. As a specific magnitude, the length $L_3$ may be, for example, 0.71 μm to 0.73 μm, and the length $L_4$ may be, for example, 0.35 μm to 0.38 μm.

The first contact portion 124 is a p type diffusion layer formed integrally with the p type diffusion layer 120, and can be produced by the same ion implantation step as the p type diffusion layer 120. The p type impurity concentration of the first contact portion 124 may be the same as the p type impurity concentration of the p type diffusion layer 120.

Additionally, the first contact portion 124 may be narrower than each of the p type diffusion layers 120 as shown in FIG. 10, and, for example, may be formed so as to have such a width as not to overlap with the first gate electrode 122 in a plan view.

Although the diffusion layer extending from each of the p type diffusion layers 120 placed on both sides (outside) of the first gate electrode 122 is referred to as the first contact portion 124 for contact with the p type diffusion layer 120 in the present preferred embodiment, all the first contact portions 124 are not necessarily required to be used for contact with the p type diffusion layer 120. In other words, in the first contact portion 124, a wiring for supplying electric power from the first power wiring 108 to the p type diffusion layer 120 is not required to be drawn around in the basic cell 113, and the first contact portion 124 can be defined as a portion that is usable as a contact.

The n type diffusion layer 123 is a diffusion layer for backgates to take a substrate potential in the p-channel type MOSFET 111, and has an n type impurity concentration higher than the n type well 119.

The n type diffusion layer 123 is formed at the surface portion of the n type well 119 below the first power wiring 108 as shown in FIG. 9, FIG. 10, and FIG. 14, and is placed in a dotted manner along the X direction. In other words, the plurality of n type diffusion layers 123 are orderly arranged along the first power wiring 108 with intervals between the n type diffusion layers 123.

In the present preferred embodiment, the region below the first power wiring 108 includes a pair of first regions 154 that overlap with a pair of first phantom lines 153 along a direction along which the pair of first contact portions 124 extend and a second region 155 placed between the pair of first regions 154. The n type diffusion layer 123 is formed in the second region 155 separated from the pair of first contact portions 124.

Additionally, the n type diffusion layer 123 is formed at a position facing the central p type diffusion layer 120 in the Y direction. Hence, the n type diffusion layer 123 adjoins the first extension portion 152 in the Y direction with the element isolation portion 114 between the n type diffusion layer 123 and the first extension portion 152 (see FIG. 14). The distance in the Y direction between the n type diffusion layer 123 and the first extension portion 152 can be appropriately determined on the basis of a design rule, such as line-and-space (L/S), and may be, for example, 0.27 µm to 0.29 µm.

In each of the basic cells 113, a region that is below the first power wiring 108 and that faces the p type diffusion layer 120 in the Y direction is a region in which the n type diffusion layer 123 is not formed. In other words, the region in which the n type diffusion layer 123 is not formed in the region below the first power wiring 108 is formed of the element isolation portion 114 except the forward end portion 150 of the first contact portion 124.

The basic gate pattern of the n-channel type MOSFET 112 is line-symmetrical with the basic gate pattern of the p-channel type MOSFET 111 when an axis A on the element isolation portion 114 that extends in the X direction between the p-channel type MOSFET 111 and the n-channel type MOSFET 112 as shown in FIG. 10 is defined as a symmetrical axis.

More specifically, the n-channel type MOSFET 112 includes an n type diffusion layer 127 that is an example of a second diffusion layer of the present invention, a second gate insulating film 128, a second gate electrode 129, a p type diffusion layer 130 that is an example of a fourth diffusion layer of the present invention, and a second contact portion 131.

The n type diffusion layer 127 is formed at the front-surface portion of the semiconductor substrate 107, and is exposed from the front surface of the semiconductor substrate 107. The n type diffusion layer 127 has an n type impurity concentration higher than the p type semiconductor substrate 107. Additionally, the number of the n type diffusion layers 127 formed in each of the basic cells 113 is three in the present preferred embodiment. Each of the n type diffusion layers 127 is formed in a rectangular shape whose length in the X direction is longer than its length in the Y direction.

For example, the length $L_2$ in the Y direction of each of the n type diffusion layers 127 is 0.52 µm to 1.24 µm. Additionally, the ratio ($L_2/L_1$) of the length $L_2$ in the Y direction of the n type diffusion layer 127 to the length $L_1$ in the Y direction of the p type diffusion layer 120 is, for example, 0.45 to 0.70, and the length $L_1$ is longer than the length $L_2$. In other words, the mobility of holes (positive holes) is smaller than the mobility of electrons, and therefore the length $L_1$ is made relatively long, and the p-channel type MOSFET 111 is formed larger than the n-channel type MOSFET 112. This makes it possible to substantially equalize the current driving capability of the p-channel type MOSFET 111 and the current driving capability of the n-channel type MOSFET 112 with each other.

The three n type diffusion layers 127 are separated from each other in the X direction (see FIG. 12). Additionally, in the present preferred embodiment, the central n type diffusion layer 127 placed between the n type diffusion layers 127 placed on both sides, respectively, among the three n type diffusion layers 127 has a width smaller than the two n type diffusion layers 127 placed on both sides.

One of the mutually-adjoining n type diffusion layers 127 is set as a source of the n-channel type MOSFET 112, and the other is set as a drain of the n-channel type MOSFET 112. Whether it functions as a source or as a drain depends on the pattern of a metal wiring (a wiring on the interlayer insulating film 135 described later) connected to each of the n type diffusion layers 127. With respect to the n-channel type MOSFET 112, one (the left-side one in the plane of paper of FIG. 10) of the two n type diffusion layers 127 placed on both sides is a diffusion layer connected to the second power wiring 109 (negative wiring) through the second contact portion 131 in the present preferred embodiment, and therefore the left-side one can be called a source region. On the other hand, the other one (the right-side one in the plane of paper of FIG. 10) of the two n type diffusion layers 127 placed on both sides may be called a drain region.

The second gate insulating film 128 includes a pair of second gate insulating films 128 that are separated from each other. Each of the second gate insulating films 128 is formed in a belt shape that extends in the Y direction, and is formed on the semiconductor substrate 107. A part of the second gate insulating film 128 overlaps with a peripheral edge portion of the n type diffusion layer 127 as shown in FIG. 12. Hence, the second gate insulating film 128 straddles between the mutually adjoining n type diffusion layers 127. Additionally, the second gate insulating film 128 is made of, for example, an insulating material, such as silicon oxide ($SiO_2$) or silicon nitride (SiN).

The second gate electrode 129 includes a pair of second gate electrodes 129 separated from each other. Each of the second gate electrodes 129 is formed on the second gate insulating film 128, and is formed in the same shape as the second gate insulating film 128. In other words, the second gate electrode 129 is formed in a belt shape that extends in the Y direction, and straddles between the mutually adjoining n type diffusion layers 127. Additionally, the second gate electrode 129 is made of, for example, a conductive material, such as polysilicon.

A portion of the semiconductor substrate 107 that faces the second gate electrode 129 with the second gate insulating film 128 between the portion and the second gate electrode 129 is a channel region 132. A channel by which the mutually adjoining n type diffusion layers 127 are electrically connected together is formed. It is possible to form an n type channel in the channel region 132 by applying an appropriate voltage to the second gate electrode 129 in a state in which a potential difference has been generated between the mutually adjoining n type diffusion layers 127.

The second gate electrode 129 additionally includes a second gate contact portion 133. The second gate contact portion 133 is formed on the element isolation portion 114 on the second-power-wiring-109 side with respect to the n type diffusion layer 127 as shown in FIG. 10 and FIG. 15. The second gate contact portion 133 is formed more widely than a part of the second gate electrode 129 on the channel region 132. More specifically, the second gate contact portion 133 is formed in such a manner as to protrude outwardly (toward the side approaching the second contact portion 131) with respect to the second gate electrode 129 on the channel region 132 in the X direction. Additionally, the second gate insulating film 128 is interposed between the second gate contact portion 133 and the element isolation portion 114.

In the present preferred embodiment, an end on the second-power-wiring-109 side of the first gate electrode 122 and an end on the first-power-wiring-108 side of the second gate electrode 129 are connected integrally with each other, and a shared gate contact portion 134 is formed. The gate contact portion 134 is formed more widely than the first gate contact portion 126 and the second gate contact portion 133.

More specifically, the gate contact portion 134 is formed in such a manner as to protrude toward both sides with respect to the first gate electrode 122 and the second gate electrode 129 in the X direction. The amount of protrusion of a part of the gate contact portion 134 that protrudes inwardly with respect to the first gate electrode 122 and the second gate electrode 129 is smaller than the amount of protrusion of the gate contact portion 134 that protrudes toward its opposite side (toward the side approaching the first contact portion 124 and the second contact portion 131).

The second contact portion 131 selectively extends from the n type diffusion layer 127 toward a region below the second power wiring 109. Hence, a forward end portion 151 of the second contact portion 131 faces the second power wiring 109 in the thickness direction of the semiconductor substrate 107. In other words, the forward end portion 151 of the second contact portion 131 overlaps with the second power wiring 109 in a plan view. It should be noted that the forward end portion 151 of the second contact portion 131 is not necessarily required to overlap with the second power wiring 109 in a plan view. Whether the forward end portion 151 of the second contact portion 131 is allowed to overlap with the second power wiring 109 or not can be appropriately determined on the basis of a design rule, such as line-and-space (L/S), for example.

In the present preferred embodiment, the second contact portion 131 selectively extends from the n type diffusion layers 127 (the two n type diffusion layers 127 on both sides) placed on both sides (outside) of the single pair of second gate electrodes 129 in the X direction. On the other hand, a second extension portion 156 whose length in the Y direction is shorter than the second contact portion 131 is connected to the n type diffusion layer 127 placed between the single pair of second gate electrodes 129. For example, the ratio ($L_6/L_5$) of the length $L_6$ in the Y direction of the second extension portion 156 (see FIG. 14) to the length $L_5$ in the Y direction of the second contact portion 131 (see FIG. 13) may be 0.50 to 0.52. As a specific magnitude, the length $L_5$ may be, for example, 0.71 μm to 0.73 μm, and the length $L_6$ may be, for example, 0.36 μm to 0.38 μm.

The second contact portion 131 is an n type diffusion layer formed integrally with the n type diffusion layer 127, and can be produced by the same ion implantation step as the n type diffusion layer 127. The n type impurity concentration of the second contact portion 131 may be the same as the n type impurity concentration of the n type diffusion layer 127.

Additionally, the second contact portion 131 may be narrower than the n type diffusion layer 127 as shown in FIG. 10, and, for example, may be formed so as to have such a width as not to overlap with the second gate electrode 129 in a plan view.

Although the diffusion layer extending from each of the n type diffusion layers 127 placed on both sides (outside) of the second gate electrode 129 is referred to as the second contact portion 131 for contact with the n type diffusion layer 127 in the present preferred embodiment, all the second contact portions 131 are not necessarily required to be used for contact with the n type diffusion layer 127. In other words, in the second contact portion 131, a wiring for supplying electric power from the second power wiring 109 to the n type diffusion layer 127 is not required to be drawn around in the basic cell 113, and the second contact portion 131 can be defined as a portion that is usable as a contact.

The p type diffusion layer 130 is a diffusion layer for backgates to take a substrate potential in the n-channel type MOSFET 112, and has a p type impurity concentration higher than the p type semiconductor substrate 107.

The p type diffusion layer 130 is formed at the front-surface portion of the semiconductor substrate 107 below the second power wiring 109 as shown in FIG. 9, FIG. 10, and FIG. 14, and is placed in a dotted manner along the X direction. In other words, the plurality of p type diffusion layers 130 are orderly arranged along the second power wiring 109 with intervals between the p type diffusion layers 130.

In the present preferred embodiment, the region below the second power wiring 109 includes a pair of third regions 158 that overlaps with a pair of second phantom lines 157 along a direction along which the pair of second contact portions 131 extend and a fourth region 159 placed between the pair of third regions 158. The p type diffusion layer 130 is formed in the fourth region 159 separated from the pair of second contact portions 131.

Additionally, the p type diffusion layer 130 is formed at a position facing the central n type diffusion layer 127 in the Y direction. Hence, the p type diffusion layer 130 adjoins the second extension portion 156 in the Y direction with the element isolation portion 114 between the p type diffusion layer 130 and the second extension portion 156 (see FIG. 14). The distance in the Y direction between the p type diffusion layer 130 and the second extension portion 156 can be appropriately determined on the basis of a design rule, such as line-and-space (L/S), and may be, for example, 0.27 μm to 0.29 μm.

In each of the basic cells 113, a region that is below the second power wiring 109 and that faces the n type diffusion layer 127 in the Y direction is a region in which the p type diffusion layer 130 is not formed. In other words, the region in which the p type diffusion layer 130 is not formed in the region below the second power wiring 109 is formed of the element isolation portion 114 except the forward end portion 151 of the second contact portion 131.

An interlayer insulating film 135 is stacked on the semiconductor substrate 107 so as to cover the first gate electrode 122 and the second gate electrode 129. The interlayer insulating film 135 is made of, for example, an insulating material, such as silicon oxide ($SiO_2$).

A wiring pattern 136 is formed on the interlayer insulating film 135. The wiring pattern 136 is made of, for example, a metal wiring, such as an aluminum wiring. The wiring pattern 136 may include a circuit wiring 137 that is connected to the first gate electrode 122, the second gate electrode 129, the p type diffusion layer 120, the n type diffusion layer 127, and so on, in addition to the first power wiring 108 and the second power wiring 109.

The pattern of the circuit wiring 137 is appropriately changed in accordance with a designed digital circuit. In the present preferred embodiment, only an aspect in which the circuit wiring 137 is connected to the first contact portion 124, to the first extension portion 152, to the second contact portion 131, to the second extension portion 156, and to the gate contact portion 134 is shown as an example as shown in FIG. 10.

Additionally, a first contact hole 160, a second contact hole 161, a third contact hole 162, a fourth contact hole 163, a fifth contact hole 164, a sixth contact hole 165, a seventh contact hole 166, an eighth contact hole 167, and a ninth contact hole 168 are formed in the interlayer insulating film 135.

One (the left-side one in the plane of paper of FIG. 10) of the pair of first contact portions 124 is electrically connected to a first branch wiring 148 that branches from the first power wiring 108 through a via 138 (for example, tungsten (W)) buried in the first contact hole 160 as shown in FIG. 10 and FIG. 13. The first branch wiring 148 perpendicularly branches from the first power wiring 108, and extends in parallel with the first contact portion 124. In the present preferred embodiment, the single first contact hole 160 is formed below the first branch wiring 148. A plurality of first contact holes 160 may be formed therebelow.

The other one (the right-side one in the plane of paper of FIG. 10) of the pair of first contact portions 124 is electrically connected to a first wiring 171 separated from the first power wiring 108 through a via 139 (for example, tungsten (W)) buried in the second contact hole 161 as shown in FIG. 10. The first wiring 171 may be drawn around in the element disposition region 110, and may be connected to the p type diffusion layer 120 or the like of another basic cell 113, for example, at a position not shown.

The first extension portion 152 is electrically connected to a second branch wiring 149 that branches from the first power wiring 108 through a via 149 (for example, tungsten (W)) buried in the third contact hole 162 as shown in FIG. 10 and FIG. 14. The second branch wiring 149 perpendicularly branches from the first power wiring 108, and extends in parallel with the first extension portion 152. In the present preferred embodiment, the single third contact hole 162 is formed below the second branch wiring 149. A plurality of third contact holes 162 may be formed therebelow.

The n type diffusion layer 123 of the p-channel type MOSFET 111 is electrically connected to the first power wiring 108 through a via 141 (for example, tungsten (W)) buried in the fourth contact hole 163 as shown in FIG. 10 and FIG. 14. Hence, the central p type diffusion layer 120 is electrically connected to the n type diffusion layer 123 through the first extension portion 152, the second branch wiring 149, and the first power wiring 108.

One (the left-side one in the plane of paper of FIG. 10) of the pair of second contact portions 131 is electrically connected to a third branch wiring 169 that branches from the second power wiring 109 through a via 142 (for example, tungsten (W)) buried in the fifth contact hole 164 as shown in FIG. 10 and FIG. 13. The third branch wiring 169 perpendicularly branches from the second power wiring 109, and extends in parallel with the second contact portion 131. In the present preferred embodiment, the single fifth contact hole 164 is formed below the third branch wiring 169. A plurality of fifth contact holes 164 may be formed therebelow.

The other one (the right-side one in the plane of paper of FIG. 10) of the pair of second contact portions 131 is electrically connected to a second wiring 172 separated from the second power wiring 109 through a via 143 (for example, tungsten (W)) buried in the sixth contact hole 165 as shown in FIG. 10. The second wiring 171 may be drawn around in the element disposition region 110, and may be connected to the n type diffusion layer 127 or the like of another basic cell 113, for example, at a position not shown.

The second extension portion 156 is electrically connected to a fourth branch wiring 170 that branches from the second power wiring 109 through a via 144 (for example, tungsten (W)) buried in the seventh contact hole 166 as shown in FIG. 10 and FIG. 14. The fourth branch wiring 170 perpendicularly branches from the second power wiring 109, and extends in parallel with the second extension portion 156. In the present preferred embodiment, the single seventh contact hole 166 is formed below the fourth branch wiring 170. A plurality of seventh contact holes 166 may be formed therebelow.

The p type diffusion layer 130 of the n-channel type MOSFET 112 is electrically connected to the second power wiring 109 through a via 145 (for example, tungsten (W)) buried in the eighth contact hole 167 as shown in FIG. 10 and FIG. 14. Hence, the central n type diffusion layer 127 is electrically connected to the p type diffusion layer 130 through the second extension portion 156, the fourth branch wiring 170, and the second power wiring 109.

The gate contact portion 134 is electrically connected to the circuit wiring 137 through a via 146 (for example, tungsten (W)) buried in the ninth contact hole 168 as shown in FIG. 10 and FIG. 15. The circuit wiring 137 may be raised to, for example, a wiring layer, which is an upper layer higher than the first power wiring 108 and the second power wiring 109, by use of another via (not shown), and may be drawn around in this wiring layer.

As described above, according to the semiconductor integrated circuit device 1, the element disposition region 110 (the first region 117 and the second region 118) of both the p-channel type MOSFET 111 and the n-channel type MOSFET 112 is formed in a region between the first power wiring 108 and the second power wiring 109. Therefore, the first power wiring 108 and the second power wiring 109 are not formed in the basic cell 113.

This makes it possible to use the space of the inside of the basic cell 113 for the layout of other wirings (for example, the circuit wiring 137 of FIG. 10), hence making it possible to improve a wiring capability in the basic cell 113. As a result, room is generated in the space for wiring layout, and therefore it is possible to shorten the length of the basic cell 113 including the p-channel type MOSFET 111 and the n-channel type MOSFET 112 in the Y direction. For example, it is possible to set the length $L_1$ of the p type diffusion layer 120 and the length $L_2$ of the n type diffusion layer 127 in the Y direction at 1.14 μm to 1.86 μm and at 0.52 μm to 1.24 μm, respectively.

Additionally, it is possible to effectively use a region below the first power wiring 108 as the first contact portion 124 for supplying electric power to the p type diffusion layer 120 as shown in FIG. 10 and FIG. 13. This makes it possible to improve a wiring capability in the basic cell 113 because a wiring (the first branch wiring 148) for supplying electric power to the p type diffusion layer 120 is not required to be long drawn around in the basic cell 113 (in the first region 117) and because it is only necessary to allow the wiring to slightly branch from the first power wiring 108.

Additionally, for example, it is possible to effectively use a region below the second power wiring 109 as the second contact portion 131 for supplying electric power to the n type diffusion layer 127 as shown in FIG. 10 and FIG. 13. This makes it possible to improve a wiring capability in the basic cell 113 because a wiring (the third branch wiring 169) for supplying electric power to the n type diffusion layer 127 is not required to be long drawn around in the basic cell 113 (in the second region 118) and because it is only necessary to allow the wiring to slightly branch from the second power wiring 109.

Additionally, it is possible to effectively use a region (the second region 155) that is located below the first power wiring 108 and that does not overlap with the first contact portion 124 as the n type diffusion layer 123 for backgates. This makes it possible to further improve a wiring capability in the basic cell 113.

Additionally, it is possible to effectively use a region (the fourth region 159) that is located below the second power wiring 109 and that does not overlap with the second contact portion 131 as the p type diffusion layer 130 for backgates. This makes it possible to further improve a wiring capability in the basic cell 113.

Additionally, the gate contact portion 134 enables a gate electrode to be shared between the p-channel type MOSFET 111 and the n-channel type MOSFET 112. This makes it possible to reduce wirings that are connected to the first gate electrode 122 and to the second gate electrode 129. As a result, the flexibility of wiring in the basic cell 113 can be improved, and therefore it is possible to further improve a wiring capability in the basic cell 113.

Although the preferred embodiment of the present invention has been described as above, the present invention can also be embodied in other modes.

Figure 16:
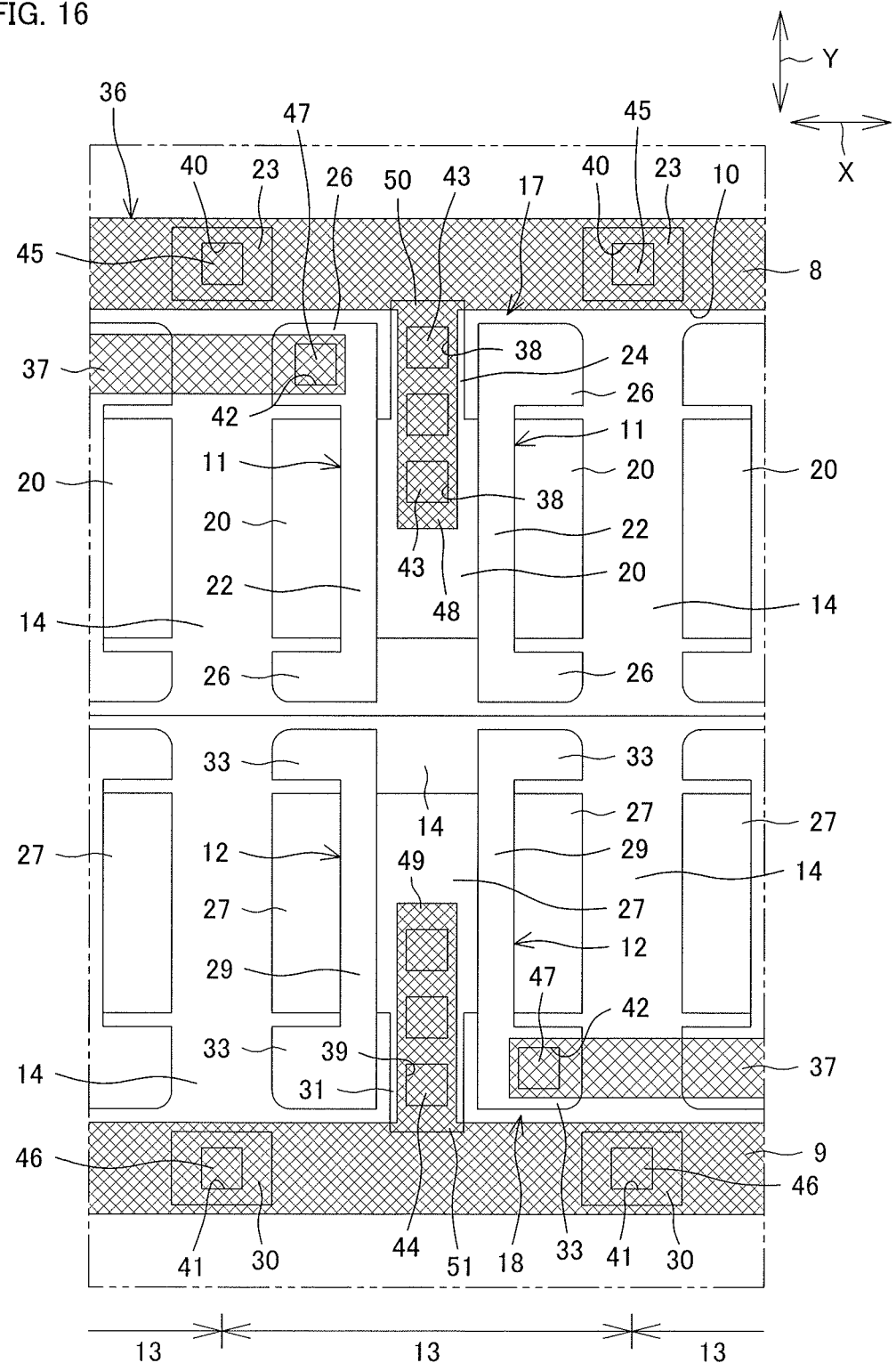
FIG. 16 is a view showing a modification of the basic cells (gate array) of FIG. 2.

For example, the first gate electrode 22 and the second gate electrode 29 may be separated from each other on the element isolation portion 14 as shown in FIG. 16. In other words, the gate electrode is not necessarily required to be shared between the p-channel type MOSFET 11 and the n-channel type MOSFET 12.

Figure 17:
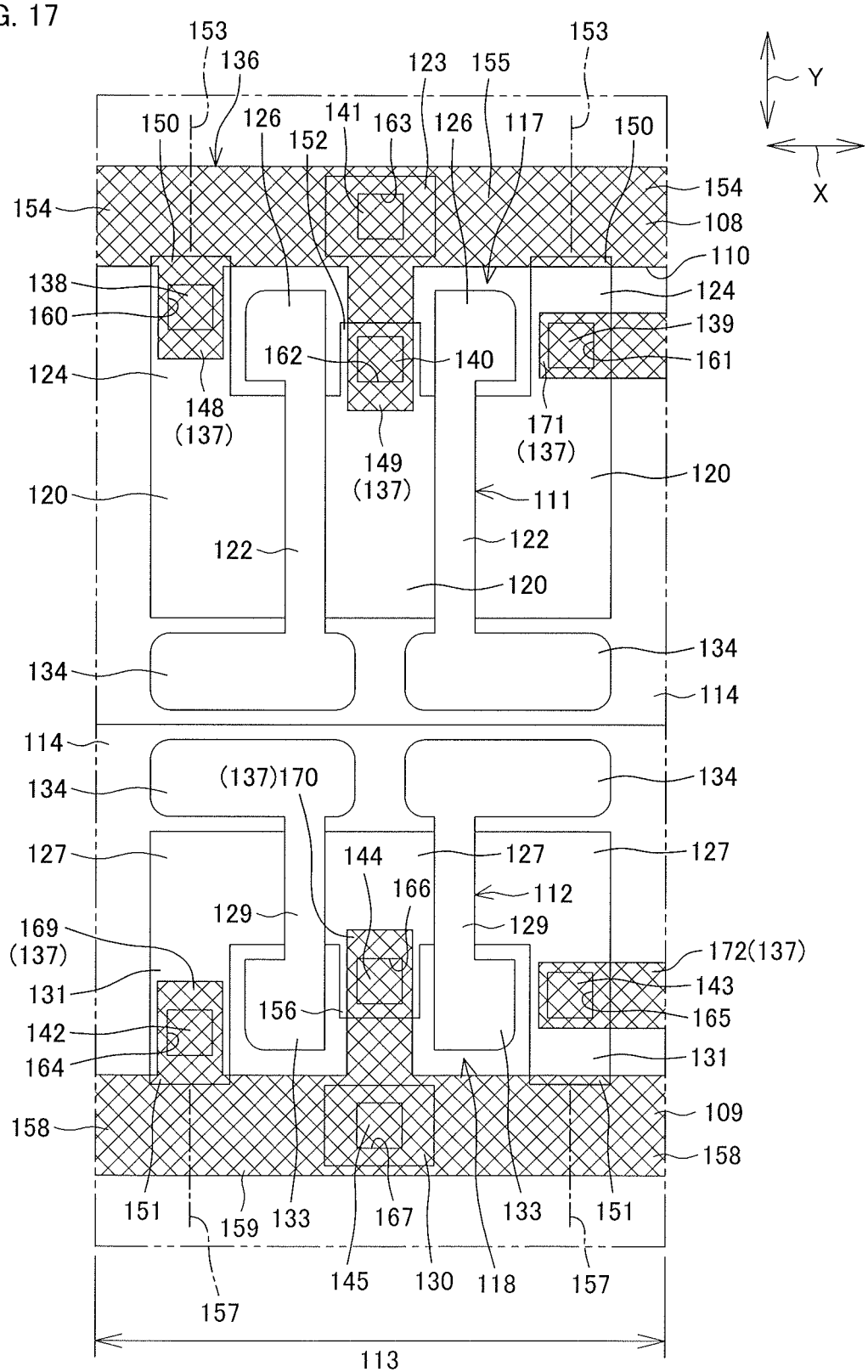
FIG. 17 is a view showing a modification of the basic cells (gate array) of FIG. 10.

Additionally, for example, the first gate electrode 122 and the second gate electrode 129 may be separated from each other on the element isolation portion 114 as shown in FIG. 17. In other words, the gate electrode is not necessarily required to be shared between the p-channel type MOSFET 111 and the n-channel type MOSFET 112. In other words, the gate contact portion 134 may be separated.

Additionally, only from the viewpoint of the avoidance of the fact that a wiring for supplying electric power to the p type diffusion layer 20 is drawn around in the basic cell 13 and the avoidance of the fact that a wiring for supplying electric power to the n type diffusion layer 27 is drawn around in the basic cell 13, a plurality of first contact portions 24 and second contact portions 31 may be provided.

Figure 18:
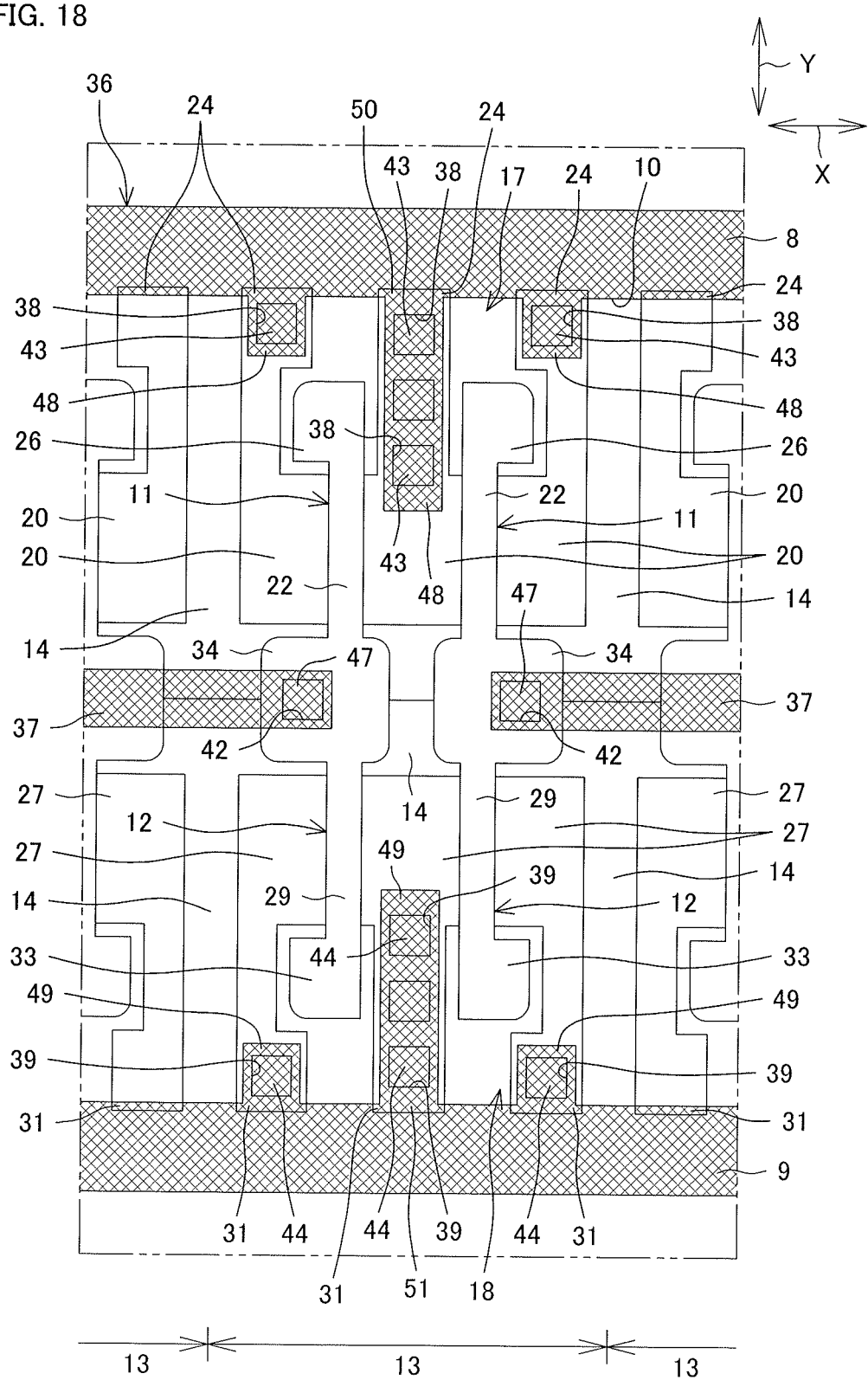
FIG. 18 is a view showing a modification of the basic cells (gate array) of FIG. 2.

For example, as shown in FIG. 18, the first contact portion 24 may extend from the p type diffusion layers 20 on both sides of the single pair of first gate electrodes 22 toward a region below the first power wiring 8, and the second contact portion 31 may extend from the n type diffusion layers 27 on both sides of the single pair of second gate electrodes 29 toward a region below the second power wiring 9.

Additionally, the pattern of the circuit wiring 37 shown in FIG. 3 and the pattern of the circuit wiring 137 shown in FIG. 10 are each merely an example, and it is possible to form a desired circuit, such as an inverter circuit, by use of the basic cells 13, 113, for example, by forming the circuit wirings 37, 137 with a predetermined pattern.

Additionally, the basic cell 13 shown in FIG. 3, FIG. 16, and FIG. 18, the basic cell 113 shown in FIG. 10 and FIG. 17, other gate-array basic cells (not shown), and standard-cell type cells may be mixedly mounted on the single semiconductor integrated circuit device 1.

For example, in the aforementioned preferred embodiment, other gate-array basic cell patterns (whose cell lengths $W_2$ and $W_3$ (cell lengths $L_1$ and $L_2$) are not reduced as in the aforementioned preferred embodiment) may be closely arranged in the third circuit cell 6 in which the area can be used comparatively wide, and the aforementioned basic cells 13, 113 or the standard-cell type cells may be closely arranged in the first circuit cell 4 and the second circuit cell 5 in both of which the area is comparatively small.

Additionally, although a case in which the package type of the semiconductor integrated circuit device 1 is SOP (Small Out-line Package) has been mentioned in FIG. 1, the package type of the semiconductor integrated circuit device 1 is not limited to this. The package type of the semiconductor integrated circuit device 1 may be, for example, QFP (Quad Flat Package), QFN (Quad Flat Non-leaded package), QFJ (Quad Flat J leaded package), SOJ (Small Out-line J leaded package), DIP (Dual In-line Package), SIP (Single In-line Package), BGA (Ball Grid Array), LGA (Land Grid Array), etc.

Besides, various design changes can be made within the scope of the matter recited in the appended claims.

The following features can be extracted from the forms of FIG. 1, FIG. 9 to FIG. 15, and FIG. 17 besides the invention defined by the appended claims.

(Item 1)

A semiconductor integrated circuit device including:

a first power wiring that is formed on a semiconductor substrate and that extends in a first direction;

a second power wiring that extends in the first direction such that the second power wiring is separated from the first power wiring;

a first diffusion layer that is used for a p-channel type MOSFET and that is formed in a region between the first power wiring and the second power wiring;

a second diffusion layer that is used for an n-channel type MOSFET and that is formed on a side of the second power wiring with respect to the first diffusion layer in the region between the first power wiring and the second power wiring;

a first gate electrode that extends in a second direction perpendicular to the first direction and that straddles the first diffusion layer;

a second gate electrode that extends in the second direction and that straddles the second diffusion layer; and a pair of first contact portions selectively extending to a region located below the first power wiring from the first diffusion layers that are formed on both sides of the first gate electrode in the first direction.

(Item 2)

The semiconductor integrated circuit device according to Item 1, wherein the first gate electrode includes a pair of first gate electrodes separated from each other, a pair of the p-channel type MOSFETs are formed of the pair of first gate electrodes, the first diffusion layer between the pair of first gate electrodes, and the first diffusion layers on both sides of the pair of first gate electrodes, and the first contact portion extends from the first diffusion layers on both sides of the pair of first gate electrodes.

(Item 3)

The semiconductor integrated circuit device according to Item 1 or Item 2, wherein the region below the first power wiring includes a pair of first regions that overlap with a pair of first imaginary lines in a direction in which the pair of first contact portions extend and a second region placed between the pair of first regions, the semiconductor integrated circuit device further includes a third diffusion layer formed in the second region such that the third diffusion layer is separated from the pair of first contact portions.

(Item 4)

The semiconductor integrated circuit device according to Item 3, wherein the third diffusion layer includes a third diffusion layer for the p-channel type MOSFET which has a conductivity type opposite to a conductivity type of the first diffusion layer.

(Item 5)

A semiconductor integrated circuit device including: a first power wiring that is formed on a semiconductor substrate and that extends in a first direction;

a second power wiring that extends in the first direction such that the second power wiring is separated from the first power wiring;

a first diffusion layer that is used for a p-channel type MOSFET and that is formed in a region between the first power wiring and the second power wiring;

a second diffusion layer that is used for an n-channel type MOSFET and that is formed on a side of the second power wiring with respect to the first diffusion layer in the region between the first power wiring and the second power wiring;

a first gate electrode that extends in a second direction perpendicular to the first direction and that straddles the first diffusion layer;

a second gate electrode that extends in the second direction and that straddles the second diffusion layer; and a pair of second contact portions selectively extending to a region located below the second power wiring from the second diffusion layers that are formed on both sides of the second gate electrode in the first direction.

(Item 6)

The semiconductor integrated circuit device according to Item 5, wherein the second gate electrode includes a pair of second gate electrodes separated from each other, a pair of the n-channel type MOSFETs are formed of the pair of second gate electrodes, the second diffusion layer between the pair of second gate electrodes, and the second diffusion layers on both sides of the pair of second gate electrodes, and the second contact portion extends from the second diffusion layers on both sides of the pair of second gate electrodes.

(Item 7)

The semiconductor integrated circuit device according to Item 5 or Item 6, wherein the region located below the second power wiring includes a pair of third regions that overlap with a pair of second imaginary lines in a direction in which the pair of second contact portions extend and a fourth region placed between the pair of third regions, the semiconductor integrated circuit device further includes a fourth diffusion layer formed in the fourth region such that the fourth diffusion layer is separated from the pair of second contact portions.

(Item 8)

The semiconductor integrated circuit device according to Item 7, wherein the fourth diffusion layer includes a fourth diffusion layer for the n-channel type MOSFET which has a conductivity type opposite to a conductivity type of the second diffusion layer.

(Item 9)

The semiconductor integrated circuit device according to any one of Item 1 to Item 8, wherein a ratio ($L_2/L_1$) of a length $L_2$ in the second direction of the second diffusion layer to a length $L_1$ in the second direction of the first diffusion layer is 0.45 to 0.70.

(Item 10)

The semiconductor integrated circuit device according to any one of Item 1 to Item 9, wherein an end portion on a side of the second power wiring of the first gate electrode and an end portion on a side of the first power wiring of the second gate electrode are connected integrally with each other.

(Item 11)

The semiconductor integrated circuit device according to Item 10, further including a gate contact portion that is formed by a connection portion between the first gate electrode and the second gate electrode and that is larger in width than the first gate electrode and the second gate electrode.

(Item 12)

The semiconductor integrated circuit device according to any one of Item 1 to Item 11, wherein a distance between the first power wiring and the second power wiring in the second direction is 3.38 μm to 3.40 μm.

(Item 13)

The semiconductor integrated circuit device according to any one of Item 1 to Item 12, wherein a plurality of basic cells each of which consists of a total of four MOSFETs that are a pair of the p-channel type MOSFETs and a pair of the n-channel type MOSFETs are arranged along the first direction in a region between the first power wiring and the second power wiring.

What is claimed is:

1. A semiconductor integrated circuit device comprising:
   a first power wiring that is formed on a semiconductor substrate and that extends in a first direction;
   a second power wiring that extends in the first direction such that the second power wiring is separated from the first power wiring;
   a first element isolation portion formed in the semiconductor substrate between the first power wiring and the second power wiring, the first element isolation portion extending in the first direction, a region between the first power wiring and the second power wiring being divided by the first element isolation portion into a first region and a second region;
   a first diffusion layer that is used for a p-channel type MOSFET and that is formed in the first region;
   a second diffusion layer that is used for an n-channel type MOSFET and that is formed in the second region;
   a gate pattern having a line-symmetrical shape when an axis on the first element isolation portion that extends in the first direction between the p-channel type MOSFET and the n-channel type MOSFET is defined as a symmetrical axis;

a plurality of third diffusion layers for backgates that are formed below at least one of the first power wiring and the second power wiring and that are arranged along the first direction with intervals between the third diffusion layers;

a second element isolation portion formed on an opposite side to the first element isolation portion with respect to the first region; and a third element isolation portion formed on an opposite side to the first element isolation portion with respect to the second region, wherein the gate pattern includes:

a first gate contact portion formed on the first element isolation portion;

a first gate electrode that extends from the first gate contact portion in a second direction perpendicular to the first direction and that straddles the first diffusion layer;

a second gate electrode that extends from the first gate contact portion in the second direction toward an opposite side to the first gate electrode and that straddles the second diffusion layer, the second gate electrode and the first gate electrode being line-symmetrical with respect to the symmetrical axis;

a second gate contact portion on an end portion of the first gate electrode on an opposite side to the first gate contact portion and on the second element isolation portion; and a third gate contact portion formed at an end portion of the second gate electrode on an opposite side to the first gate contact portion and on the third element isolation portion, the third gate contact portion and the second gate contact portion being line-symmetrical with respect to the symmetrical axis.

2. The semiconductor integrated circuit device according to claim 1, wherein the plurality of third diffusion layers include a third diffusion layer for a p-channel type MOSFET which is formed below the first power wiring, and has a conductivity type opposite to a conductivity type of the first diffusion layer, and the semiconductor integrated circuit device further comprises a first contact portion that selectively extends from the first diffusion layer toward a region below the first power wiring in which the third diffusion layer for the p-channel type MOSFET is not formed.

3. The semiconductor integrated circuit device according to claim 2, wherein the first gate electrode includes a pair of first gate electrodes separated from each other, a pair of p-channel type MOSFETs are formed of the pair of first gate electrodes, the first diffusion layer between the pair of first gate electrodes, and the first diffusion layers on both sides of the pair of first gate electrodes, and the first contact portion extends from the first diffusion layer between the pair of first gate electrodes.

4. The semiconductor integrated circuit device according to claim 2, wherein a length of the first diffusion layer in the second direction is 0.95 μm to 1.48 μm.

5. The semiconductor integrated circuit device according to claim 1, wherein the plurality of third diffusion layers include a third diffusion layer for an n-channel type MOSFET which is formed below the second power wiring, and has a conductivity type opposite to a conductivity type of the second diffusion layer, and the semiconductor integrated circuit device further comprises a second contact portion that selectively extends from the second diffusion layer toward a region below the second power wiring in which the third diffusion layer for the n-channel type MOSFET is not formed.

6. The semiconductor integrated circuit device according to claim 5, wherein the second gate electrode includes a pair of second gate electrodes separated from each other, a pair of n-channel type MOSFETs are formed of the pair of second gate electrodes, the second diffusion layer between the pair of second gate electrodes, and the second diffusion layers on both sides of the pair of second gate electrodes, and the second contact portion extends from the second diffusion layer between the pair of second gate electrodes.

7. The semiconductor integrated circuit device according to claim 5, wherein a length of the second diffusion layer in the second direction is 0.81 μm to 1.34 μm.

8. The semiconductor integrated circuit device according to claim 1, wherein an end portion on a side of the second power wiring of the first gate electrode and an end portion on a side of the first power wiring of the second gate electrode are connected integrally with each other at the first gate contact portion.

9. The semiconductor integrated circuit device according to claim 8, wherein the first gate contact portion is larger in width than the first gate electrode and the second gate electrode.

10. The semiconductor integrated circuit device according to claim 1, wherein a distance between the first power wiring and the second power wiring in the second direction is 3.38 μm to 3.40 μm.

11. The semiconductor integrated circuit device according to claim 1, wherein a plurality of cells, each of which consists of a total of four MOSFETs that are a pair of the p-channel type MOSFETs and a pair of the n-channel type MOSFETs, are arranged along the first direction in a region between the first power wiring and the second power wiring.

12. The semiconductor integrated circuit device according to claim 11, wherein the pair of the p-channel type MOSFETs and the pair of the n-channel type MOSFETs are line-symmetrical with respect to the symmetrical axis.

13. The semiconductor integrated circuit device according to claim 1, wherein the second gate contact portion has a width larger than a width of the first gate electrode and smaller than a width of the first gate contact portion.

14. The semiconductor integrated circuit device according to claim 13, wherein the second gate contact portion is formed in a shape that projects to one side with respect to the first gate electrode in the first direction, and the first gate contact portion is formed in a shape that projects to both sides with respect to the first gate electrode in the first direction.

15. The semiconductor integrated circuit device according to claim 1, wherein the third gate contact portion has a width larger than a width of the second gate electrode and smaller than a width of the first gate contact portion.

16. The semiconductor integrated circuit device according to claim 15, wherein the third gate contact portion is formed in a shape that projects to one side with respect to the second gate electrode in the second direction, and the first gate contact portion is formed in a shape that projects to both sides with respect to the second gate electrode in the second direction.

17. The semiconductor integrated circuit device according to claim 1, further comprising a gate insulating film formed between the first gate contact portion and the first element isolation portion.

* * * * *